(12) United States Patent
Hogyoku

(10) Patent No.: US 11,894,407 B2
(45) Date of Patent: Feb. 6, 2024

(54) IMAGING APPARATUS AND ELECTRONIC DEVICE

(71) Applicant: SONY SEMICONDUCTOR SOLUTIONS CORPORATION, Kanagawa (JP)

(72) Inventor: Susumu Hogyoku, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 171 days.

(21) Appl. No.: 17/250,249

(22) PCT Filed: Apr. 26, 2019

(86) PCT No.: PCT/JP2019/017840
§ 371 (c)(1),
(2) Date: Dec. 21, 2020

(87) PCT Pub. No.: WO2020/003732
PCT Pub. Date: Jan. 2, 2020

(65) Prior Publication Data
US 2021/0273005 A1 Sep. 2, 2021

(30) Foreign Application Priority Data

Jun. 29, 2018 (JP) ................................ 2018-124007

(51) Int. Cl.
H01L 27/146 (2006.01)
H01L 23/00 (2006.01)
H04N 23/54 (2023.01)

(52) U.S. Cl.
CPC ........ H01L 27/14636 (2013.01); H01L 24/16 (2013.01); H01L 27/14618 (2013.01); H04N 23/54 (2023.01); H01L 2224/16227 (2013.01)

(58) Field of Classification Search
None
See application file for complete search history.

(56) References Cited

U.S. PATENT DOCUMENTS

2005/0051859 A1* 3/2005 Hoffman ............. H01L 31/0203
257/E31.118
2008/0191297 A1* 8/2008 Yang ................. H01L 27/14687
257/E31.128
(Continued)

FOREIGN PATENT DOCUMENTS

CN 108604574 A 9/2018
JP 2004-335660 A 11/2004
(Continued)

OTHER PUBLICATIONS

International Search Report and Written Opinion of PCT Application No. PCT/JP2019/017840, dated Jul. 16, 2019, 09 pages of ISRWO.

Primary Examiner — Hung K Vu
(74) Attorney, Agent, or Firm — CHIP LAW GROUP

(57) ABSTRACT

Provided are an imaging apparatus and an electronic device in which even if an image sensor is mounted on a wiring board, the wiring board on which the image sensor is mounted can be assembled to a housing with high accuracy. Provided is an imaging apparatus including a sensor chip and a wiring board having a glass base material. The imaging apparatus is joined to at least one of the sensor chip or the wiring board via a bump unit including a plurality of bumps, and each of the plurality of bumps is formed by conductive members having substantially the same composition.

13 Claims, 31 Drawing Sheets

(56) References Cited

U.S. PATENT DOCUMENTS

2011/0084118 A1    4/2011   Wada et al.
2019/0019737 A1    1/2019   Hogyoku
2021/0273005 A1*   9/2021   Hogyoku .......... H01L 27/14618

FOREIGN PATENT DOCUMENTS

| JP | 2011-086670 A | 4/2011 |
| JP | 4818750 B2 | 11/2011 |
| JP | 5376865 B2 | 12/2013 |
| JP | 2017-139316 A | 8/2017 |
| WO | 2017/135062 A1 | 8/2017 |

* cited by examiner

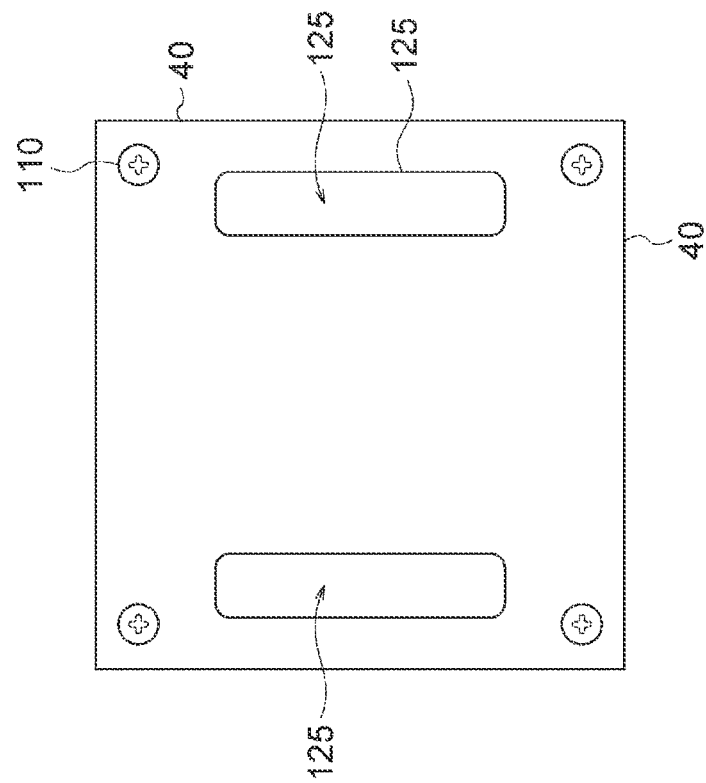
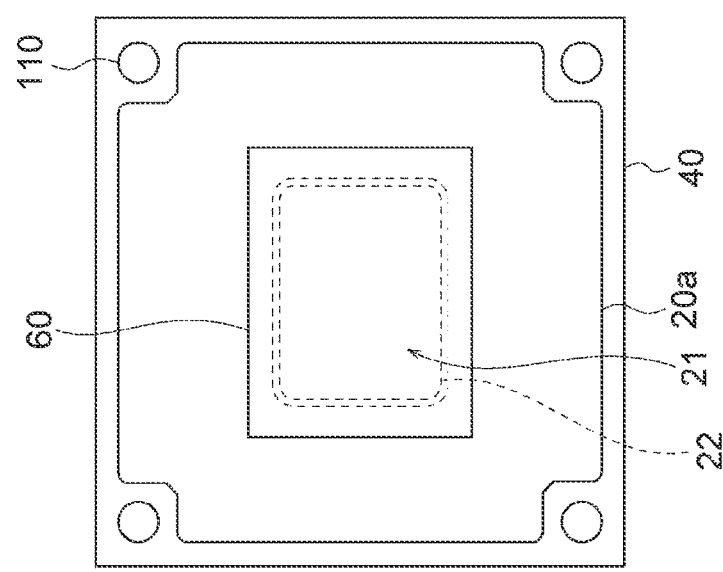

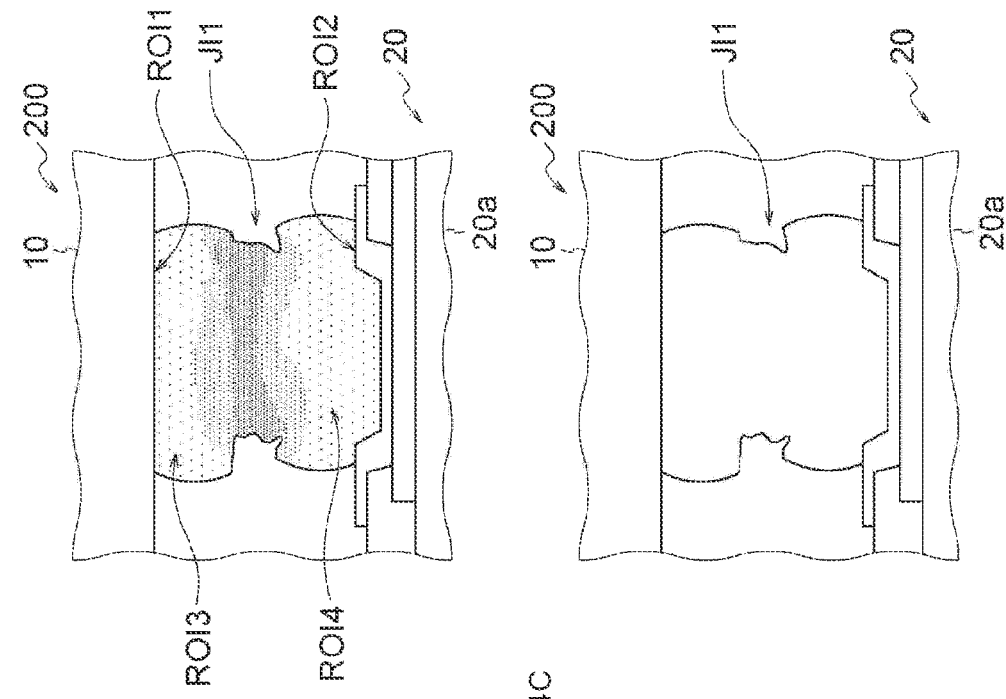
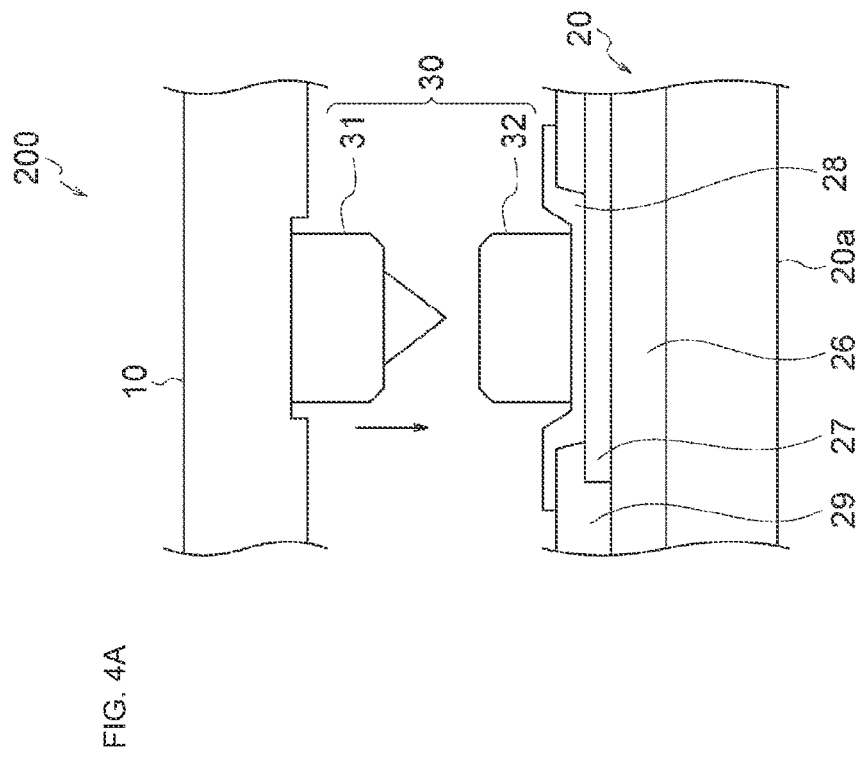

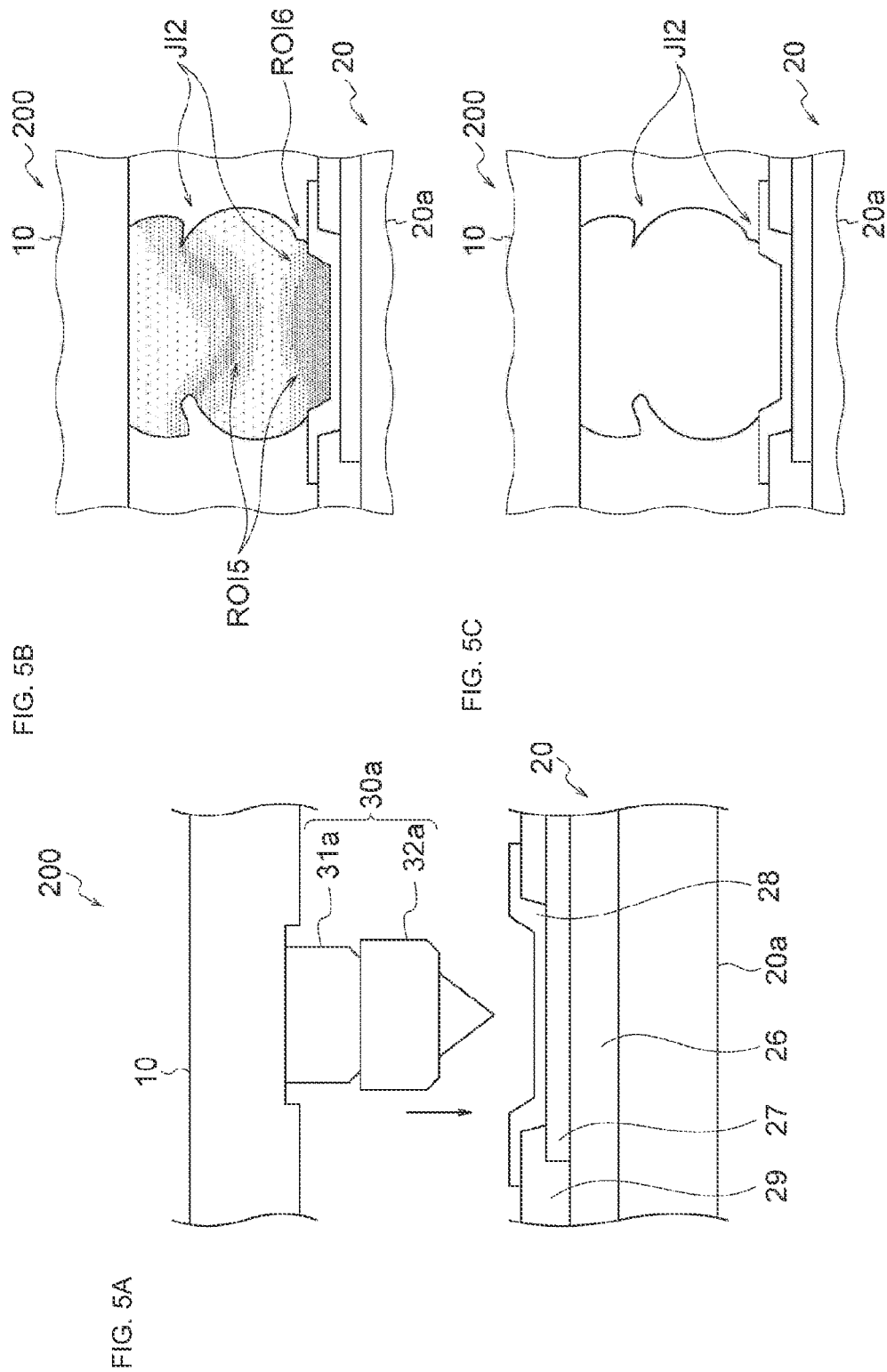

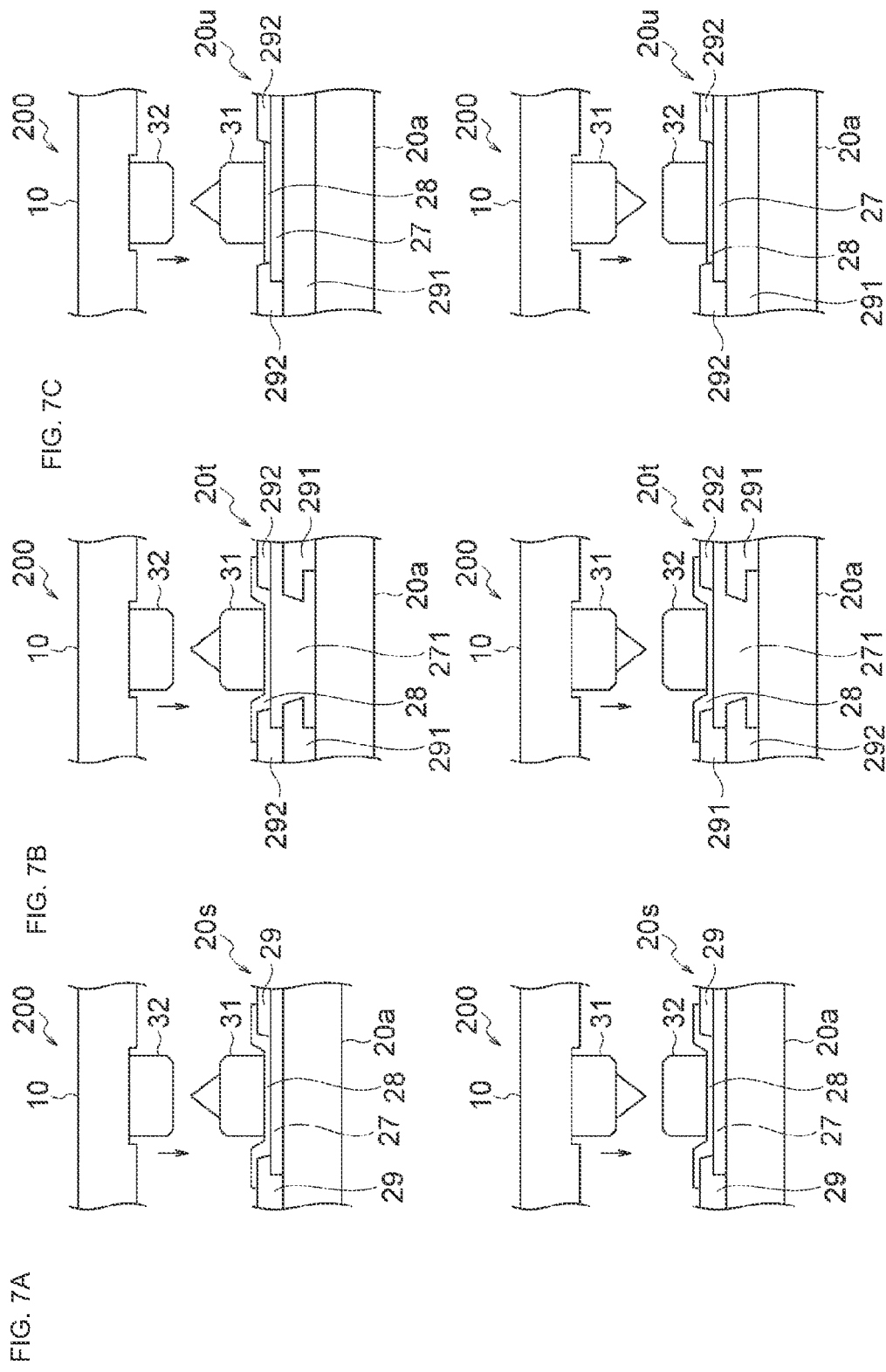

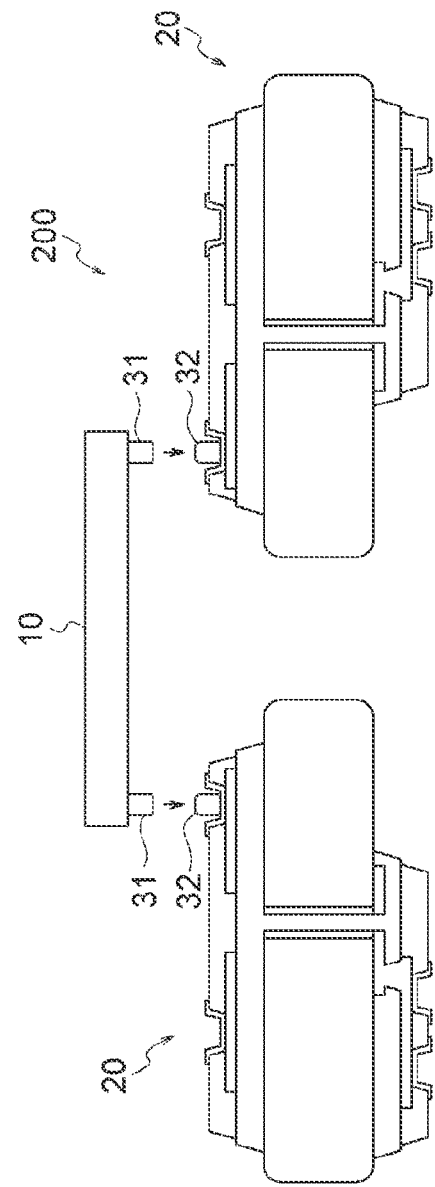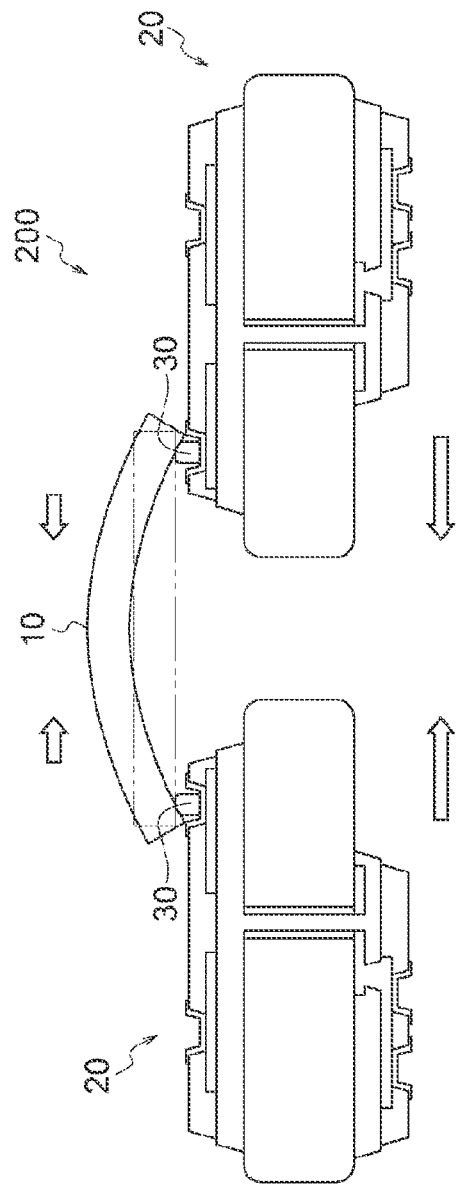

IMAGING APPARATUS AND ELECTRONIC DEVICE

CROSS REFERENCE TO RELATED APPLICATIONS

This application is a U.S. National Phase of International Patent Application No. PCT/JP2019/017840 filed on Apr. 26, 2019, which claims priority benefit of Japanese Patent Application No. JP 2018-124007 filed in the Japan Patent Office on Jun. 29, 2018. Each of the above-referenced applications is hereby incorporated herein by reference in its entirety.

TECHNICAL FIELD

The present technology relates to an imaging apparatus and an electronic device, and particularly to a technology of an imaging apparatus and an electronic device in which an image sensor is mounted on a wiring board and the wiring board on which the image sensor is mounted is assembled to a housing.

BACKGROUND ART

In recent years, digital cameras and mobile phones have become more and more popular. Along with this, the demand for solid-state imaging devices (image sensors), which are the central components of digital cameras, is increasing more and more. In solid-state imaging devices such as complementary metal oxide semiconductor (CMOS) image sensors, miniaturization of pixels has been advanced, and lenses with a small F value (focal Number) are used to increase the amount of light per pixel. Note that the F value is a value obtained by dividing a focal length of a lens by an effective aperture.

When a lens with a small F value is used, a depth of focus of the lens of the solid-state imaging device becomes shallow. Then, when assembling a wiring board including a CMOS image sensor to a housing of a camera, it is important to prevent the optical axis of the CMOS image sensor from tilting with respect to a reference surface of the housing.

Here, for example, an imaging apparatus in which a CMOS image sensor is mounted on a wiring board is disclosed (see Patent Documents 1 and 2).

CITATION LIST

Patent Document

Patent Document 1: Japanese Patent No. 05376865
Patent Document 2: Japanese Patent No. 04818750

SUMMARY OF THE INVENTION

Problems to be Solved by the Invention

When mounting a CMOS image sensor on a wiring board, if the CMOS image sensor is mounted on a member whose wiring board is not flat, the mounted CMOS image sensor may be tilted on the wiring board. Furthermore, when assembling a wiring board on which a CMOS image sensor is mounted to a housing, in a case where an assembling reference surface is not flat, an optical axis of the CMOS image sensor may shift.

The present technology has been made in view of such a situation, and has a main object to provide an imaging apparatus and an electronic device in which, even if a CMOS image sensor is mounted on a wiring board, the wiring board on which the CMOS image sensor is mounted can be assembled to a housing with high accuracy.

Solutions to Problems

As a result of diligent research to solve the above-mentioned object, the present inventor has succeeded in assembling a wiring board on which a CMOS image sensor is mounted in a housing with high accuracy even if the CMOS image sensor is mounted on the wiring board, and completed the present technology.

That is, in the present technology, first provided is
an imaging apparatus including
a sensor chip and
a wiring board having a glass base material,
in which the imaging apparatus is joined to at least one of the sensor chip or the wiring board via a bump unit including a plurality of bumps, and
each of the plurality of bumps is formed by conductive members having substantially the same composition.

In the imaging apparatus according to the present technology, the bump unit may include a first bump and a second bump,
the first bump may be formed on the sensor chip, the second bump may be formed on the wiring board, and the sensor chip and the wiring board may be joined to each other, and
a thickness of the first bump and a thickness of the second bump may be 2 µm or more and 50 µm or less, respectively.

In the imaging apparatus according to the present technology, at least one of the plurality of bumps may be formed on an upper surface of the wiring board, and a laminated wiring layer including an insulating layer and a metal wiring layer may not be formed in a region of a lower surface of the wiring board facing the at least one of the plurality of bumps. Furthermore, in the imaging apparatus according to the present technology, at least one of the plurality of bumps may be formed on an upper surface of the wiring board, and a laminated wiring layer including an insulating layer and a metal wiring layer may be formed in a region of a lower surface of the wiring board facing the at least one of the plurality of bumps. In this case, the laminated wiring layer may be formed in at least two or more of the region, and layer configurations of wiring layers forming the laminated wiring layer formed in the two or more regions may be substantially the same.

In the imaging apparatus according to the present technology, a protective member that protects the sensor chip may be further provided,
the sensor chip may be fixed between the protective member and the wiring board, and
an adhesive may be arranged on the glass base material and the wiring layer of the wiring board, and the glass base material and the wiring layer of the wiring board may be adhered to the protective member.

In the imaging apparatus according to the present technology, a cushioning material may be arranged between the sensor chip and the protective member. In the imaging apparatus according to the present technology,
the protective member may be fixed to a housing that accommodates the sensor chip.

In the imaging apparatus according to the present technology, provided is an imaging apparatus including
a sensor chip, a wiring board having a glass base material, and
a protective member that protects the sensor chip,
in which an adhesive is arranged on the glass base material and a wiring layer of the wiring board, and the glass base material and the wiring layer of the wiring board are adhered to the protective member.

In an electronic device according to the present technology, provided is an electronic device including an imaging apparatus mounted, the imaging apparatus including at least
a sensor chip and
a wiring board having a glass base material,
in which the imaging apparatus is joined to at least one of the sensor chip or the wiring board via a bump unit including a plurality of bumps, and
each of the plurality of bumps is formed by conductive members having substantially the same composition.

Effects of the Invention

According to the present technology, even if an image sensor is mounted on a wiring board, the wiring board on which the image sensor is mounted can be assembled to a housing with high accuracy. Note that the effects of the present technology are not necessarily limited to the effects described above, and any of the effects described in the present technology may be applied.

BRIEF DESCRIPTION OF DRAWINGS

FIGS. 2A and 2B are top views and a bottom view showing the configuration of the imaging apparatus according to the first embodiment to which the present technology is applied.

FIGS. 4A, 4B, and 4C show an analysis image of a bonding cross section of a bump unit of the imaging apparatus of the first embodiment to which the present technology is applied.

FIGS. 5A, 5B, and 5C show an analysis image of a bonding cross section of a bump unit of the imaging apparatus of the first embodiment to which the present technology is applied as a comparative example.

FIGS. 7A, 7B, and 7C are explanatory diagrams showing a configuration example of the imaging apparatus according to the first embodiment to which the present technology is applied.

FIGS. 8A and 8B are explanatory diagrams showing a state in which, in the imaging apparatus of the first embodiment to which the present technology is applied, warp of a sensor chip is controlled.

MODE FOR CARRYING OUT THE INVENTION

Figure 1:
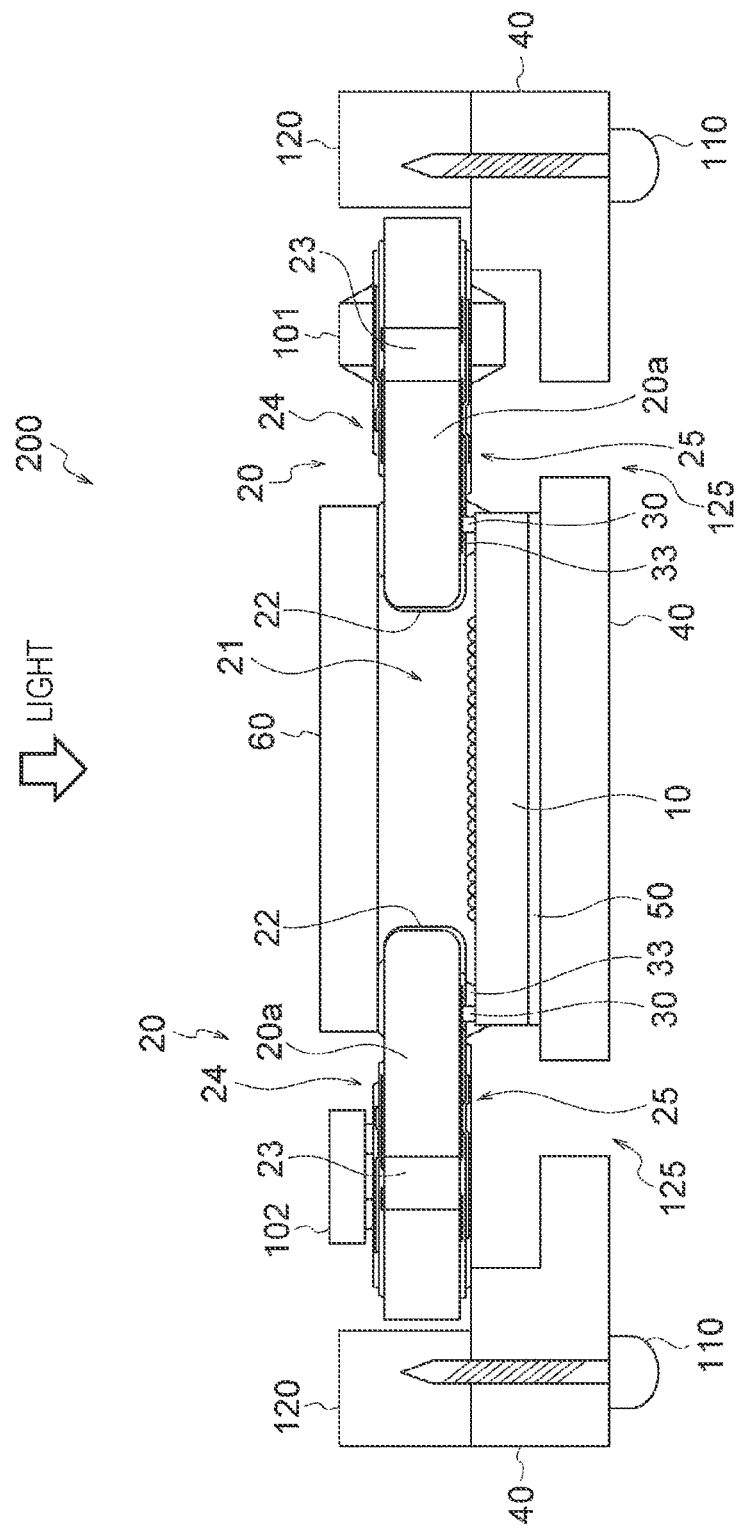
FIG. 1 is a cross-sectional view showing a configuration of an imaging apparatus according to a first embodiment to which the present technology is applied.

Hereinafter, suitable modes for carrying out the present technology will be described with reference to the drawings. Note that the embodiments described below are examples of typical embodiments of the present technology, and the scope of the present technology should not be construed narrowly.

Note that the description will be given in the following order.

1. Outline of the present technology
2. Imaging apparatus of first embodiment
3. Imaging apparatus of second embodiment
4. Imaging apparatus of third embodiment
5. Imaging apparatus of fourth embodiment
6. Imaging apparatus of fifth embodiment
7. Imaging apparatus of sixth embodiment
8. Imaging apparatus of seventh embodiment
9. Imaging apparatus of eighth embodiment
10. Imaging apparatus of ninth embodiment
11. Imaging apparatus of tenth embodiment
12. Imaging apparatus of eleventh embodiment
13. Imaging apparatus of twelfth embodiment
14. Thirteenth embodiment of electronic device
15. Use example of imaging apparatus to which the present technology is applied
16. Application example to endoscopic surgery system
17. Application example to mobile body 1. Outline of the Present Technology The present technology relates to an imaging apparatus and an electronic device in which an image sensor is mounted on a wiring board and the wiring board on which the image sensor is mounted is assembled to a housing. According to the present technology, even if a charge coupled device (CCD) image sensor or complementary metal oxide semiconductor (CMOS) image sensor is mounted on a wiring board, the wiring board on which the CCD image sensor or CMOS image sensor is mounted can be assembled to a housing with high precision.

First, a sensor chip (for example, a CMOS image sensor) is mounted on a wiring board. Then, the wiring board on which the sensor chip is mounted is connected to the housing. Here, for example, in a case where a flexible board is applied to the wiring board, a metal plate may be arranged on a rear surface of the sensor chip because it is necessary to hold the sensor chip.

When the metal plate is attached to the sensor chip, the assembly accuracy is determined by the accuracy of attaching the sensor chip to the metal plate and the processing accuracy of the metal plate. Note that the assembly accuracy is sometimes called tilting. In this case, if a metal plate is used to hold the sensor chip, very expensive processing is required. Moreover, in order to ensure adhesive strength and deformation resistance to impacts or the like of the adhesive that adheres between the metal plate and the sensor chip, it is necessary to use an adhesive having a high Young's modulus to some extent such as epoxy. In this case, there is a concern that thermal stress is generated due to the difference in linear expansion between the metal plate and the sensor chip, causing deformation of the sensor chip.

The present technology has been made in view of the circumstances described above, and is an imaging apparatus in which, instead of mounting the sensor chip directly on the metal plate, the sensor chip and the wiring board having a glass base material are joined via a plurality of bumps, the sensor chip is mounted on the wiring board so as to follow a degree of flatness of the glass base material, and the wiring board on which the sensor chip is mounted is assembled to the metal plate or a protective member which is a housing. According to a present technology, even if the sensor chip is mounted on the wiring board, the wiring board on which the sensor chip is mounted can be assembled to the housing with high accuracy without deforming the sensor chip.

2. Imaging Apparatus of First Embodiment

An imaging apparatus of the first embodiment according to the present technology includes a sensor chip and a wiring board having a glass base material, in which the imaging apparatus is joined to at least one of the sensor chip or the wiring board via a bump unit including a plurality of bumps, and each of the plurality of bumps is formed by conductive members having substantially the same composition. Furthermore, in the first embodiment, the bump unit includes a first bump and a second bump, the first bump is formed on the sensor chip, the second bump is formed on the wiring board, and the sensor chip and the wiring board are joined to each other, and a thickness of the first bump and a thickness of the second bump are 2 µm or more and 50 µm or less, respectively.

According to the imaging apparatus of the first embodiment according to the present technology, even if the sensor chip is mounted on the wiring board, the wiring board on which the sensor chip is mounted can be assembled to the housing with high accuracy.

Figure 3:
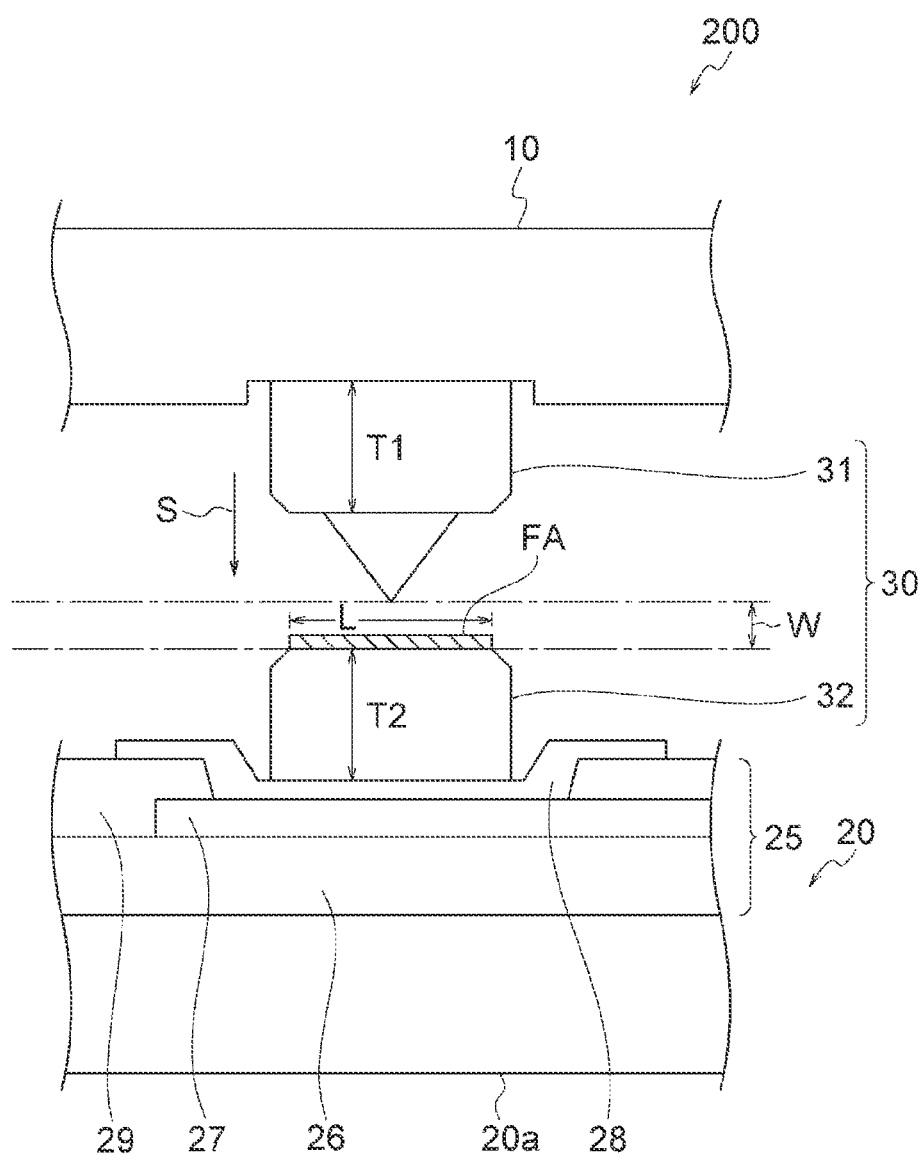
FIG. 3 is a partially enlarged view showing the configuration of the imaging apparatus according to the first embodiment to which the present technology is applied.

FIGS. 1, 2A, 2B, and 3 show an imaging apparatus 200 which is an example of the imaging apparatus of the first embodiment according to the present technology. FIG. 1 shows a cross-sectional view of the imaging apparatus 200. FIGS. 2A and 2B show a top view and a bottom view of the imaging apparatus 200. FIG. 3 shows a partially enlarged view of a bonding portion of a plurality of bumps 30.

Note that FIGS. 2A and 2B show a top view of the imaging apparatus 200 in FIG. 2A and a bottom view in FIG. 2B. Unless otherwise specified, "up" means an upward direction in each figure, and "down" means a downward direction in each figure.

The imaging apparatus 200 includes a sensor chip 10 and a wiring board 20 having a glass base material 20a, in which the imaging apparatus 200 is joined to at least one of the sensor chip 10 or the wiring board 20 via a bump unit 30 including a plurality of bumps, and each of the plurality of bumps is formed by conductive members having substantially the same composition. Note that, in the sensor chip 10 and the wiring board 20, both the base material of the sensor chip 10 and the glass base material 20a of the wiring board 20 are flat. Furthermore, it will be described later that bumps are formed by conductive members having substantially the same composition.

For example, the bump unit 30 includes a first bump and a second bump, the first bump 31 is formed on the sensor chip 10, the second bump 32 is formed on the wiring board 20, and the sensor chip 10 and the wiring board 20 are joined to each other. Furthermore, the thickness of the first bump 31 and the thickness of the second bump 32 is 2 µm or more and 50 µm or less, respectively (see FIG. 3).

Note that, in the first embodiment, the bump unit 30 includes two bumps, but the number of bumps is not limited to two. For example, the bump unit 30 may include one first bump 31 and a plurality of second bumps 32, may include a plurality of first bumps 31 and one second bump 32, or may include a plurality of first bumps 31 and a plurality of second bumps 32. For example, the thickness of the bump formed on the sensor chip 10 and the thickness of the bump formed on the wiring board 20 may form the same thickness, and the size of the unit for one bump is not particularly limited.

First, the configuration of the imaging apparatus 200 will be described according to an optical path of light incident on a cover glass 60. The imaging apparatus 200 includes the cover glass 60, the wiring board 20, the sensor chip 10, and the protective member 40 in this order from the incident side of the light. The wiring board 20 is joined to the cover glass 60 and the sensor chip 10 and is assembled to a housing 120. The housing 120 is joined to the protective member 40 by screws 110.

The cover glass 60 transmits the incident light and irradiates a light receiving surface of the sensor chip 10 with the light through an opening 21 (see FIG. 2A) of the wiring board 20. The cover glass 60 is provided on the incident side of the light of the wiring board 20 in order to protect the sensor chip 10.

The wiring board 20 is provided between the cover glass 60 and the sensor chip 10. The wiring board 20 is joined to the sensor chip 10 via the bump unit 30. Furthermore, the wiring board 20 has an underfiller 33 for protecting the bump unit 30 between the wiring board 20 and the sensor chip 10.

Furthermore, the wiring board 20 has an antireflection film 22, a through electrode 23, a laminated wiring layer 24, and a laminated wiring layer 25. The antireflection film 22 is provided so that the light transmitted through the cover glass 60 is not reflected in the opening 21 of the wiring board 20. The through electrode 23 is an electrode that penetrates the wiring board 20, and is, for example, electrically connected to a component 101 and a component 102 on the light incident side of the wiring board 20. The laminated wiring layer 24 and the laminated wiring layer 25 are laminated wiring layers in which an insulating layer and a metal wiring layer are laminated.

The protective member 40 is a protective member for protecting the sensor chip 10. The protective member 40 may have a lid shape in order to protect the sensor chip 10, for example. The protective member 40 may be formed by, for example, a metal, a resin, carbon, or the like, or may be a member in which a metal and a resin are composited.

Specifically, copper (Cu), aluminum (Al), and alloys such as molybdenum copper alloy (CuMo), nickel-iron alloy (FeNi), and steel use stainless (SUS) can be applied as the metal. Furthermore, copper (Cu), invar (iron alloy), copper (Cu) clad material, and the like can also be applied. Molding materials, carbon fiber reinforced plastics (CFRP), glass, and the like can be applied as the resin. Furthermore, a composite member in which a molding material and a copper (Cu) plate are joined to each other can be applied as a member in which a metal and a resin are composited. Furthermore, the protective member 40 has a cushioning material 50 between the protective member 40 and the sensor chip 10.

The cushioning material 50 is arranged between the sensor chip 10 and the protective member 40 for the purpose of preventing interference between the sensor chip 10 and the protective member 40. A silicone-based resin can be applied as the cushioning material 50. Furthermore, the cushioning material 50 may be hollow.

The protective member 40 is fixed to the housing 120 that houses the sensor chip 10.

Note that the housing 120 is not shown in FIGS. 2A and 2B. Furthermore, in FIG. 2B, a slit 125 is formed. The slit 125 is a gap provided in a part of the protective member 40. Note that, with the slit 125, desired shape can be given to the protective member 40.

The partially enlarged view shown in FIG. 3 shows a bonding portion of the bump unit 30. The upper side of FIG. 3 shows that the first bump 31 is formed on the sensor chip 10. On the other hand, the lower side of FIG. 3 shows that the second bump 32 is formed on the wiring board 20. The laminated wiring layer 25 is formed on the wiring board 20. The laminated wiring layer 25 is formed including an insulating layer 26, a metal wiring 27, a pad 28, and an insulating layer 29.

Here, a thickness T1 of the first bump 31 formed on the sensor chip 10 and a thickness T2 of the second bump 32 formed on the wiring board 20 are 2 μm or more and 50 μm or less, respectively.

For the sensor chip 10 shown in FIG. 3, when a load is applied to the wiring board 20 in a direction S (downward), the first bump 31 of the sensor chip 10 and the second bump 32 of the wiring board 20 are deformed. Therefore, in the imaging apparatus 200 of the first embodiment, the sensor chip 10 and the wiring board 20 can be joined.

With such a configuration, in the imaging apparatus 200 of the first embodiment, the sensor chip 10 and the wiring board 20 can be joined via the bump unit 30 including the first bump 31 of the sensor chip 10 and the second bump 32 of the wiring board 20.

As described above, the imaging apparatus 200 of the first embodiment includes the sensor chip 10 and the wiring board 20 having the glass base material 20a. The imaging apparatus 200 of the first embodiment is joined to at least one of the sensor chip 10 or the wiring board 20 via a bump unit 30 including a plurality of bumps. Furthermore, the plurality of bumps is formed by conductive members having substantially the same composition.

Therefore, in the imaging apparatus 200 of the first embodiment, since both the sensor chip 10 and the wiring board 20 have high degree of flatness, as shown in FIG. 3, a width W of the first bump 31 and the second bump 32 can be controlled for all bump units 30. Furthermore, by uniformly flattering the first bump 31 and the second bump 32 in the bump unit 30, the amount of deformation of the first bump 31 and the second bump 32 can be controlled to the same extent. Therefore, for example, high-precision bonding can be achieved even in a mounting with a large number of pins. Moreover, since the sensor chip 10 and the wiring board 20 have high degree of flatness, even if the wiring board 20 on which the sensor chip 10 is mounted is assembled to the housing 120, the wiring board 20 can be assembled with high accuracy.

Furthermore, according to the imaging apparatus 200 of the first embodiment, since the first bump 31 and the second bump 32 are formed by conductive members having substantially the same composition, the sensor chip 10 and the wiring board 20 can be joined with high precision. Here, the point that the sensor chip 10 and the wiring board 20 can be joined with high accuracy will be described with reference to FIGS. 4A, 4B, 4C, 5A, 5B, and 5C.

FIGS. 4A, 4B, and 4C show a boding cross section of the bump unit 30 formed including the first bump 31 of the sensor chip 10 and the second bump 32 of the wiring board 20. FIGS. 4A, 4B, and 4C show an analysis image of a bonding cross section of the bump unit 30 of the imaging apparatus 200 of the first embodiment. Unless otherwise specified, "up" means an upward direction in FIGS. 4A, 4B, and 4C, and "down" means a downward direction in FIGS. 4A, 4B, and 4C.

Note that in FIGS. 4A, 4B, and 4C, FIG. 4A shows a cross-sectional view of the sensor chip 10 and 20 before bonding, FIG. 4B shows an electron backscatter diffraction pattern (EBSP) image of the sensor chip 10 and the wiring board 20 after bonding, and FIG. 4C shows a scanning electron microscope (SEM) image of the sensor chip 10 and the wiring board 20 after bonding. Note that the EBSP image in FIG. 4B is an image obtained by backscattered electron diffraction, and the SEM image in FIG. 4C is an image obtained by irradiating a sample with an electron beam and observing the surface.

FIG. 4A shows that the first bump 31 is formed on the sensor chip 10 and the second bump 32 is formed on the wiring board 20, as similar to FIG. 3.

It is shown that, at a bonding interface JI1 in FIG. 4B, the first bump 31 and the second bump 32 are crushed and deformed by the pressing force at the time of bonding the sensor chip 10 and the wiring board 20, and stress is concentrated in the crushed region. It is shown that, particularly at the bonding interface JI1, particles with a high Miller index (also called grains) are concentrated. Furthermore, it is shown that, in a region ROI1, the grains are not concentrated between the sensor chip 10 and the first bump 31. Similarly, it is shown that, also in a region ROI2, the grains are not concentrated between the wiring board 20 and the second bump 32.

It is shown that, since a region ROI3 in FIG. 4B is a region separated from the bonding interface JI1 by 2 µm or more upward, the first bump 31 is not affected by the pressing of the sensor chip 10 and a large grain is formed. For the first bump 31, for example, gold or copper can be used as a conductive member having substantially the same composition as the second bump 32. Since gold and copper are soft and easily deformed, the first bump 31 can be diffusion-joined at a low temperature and a low load. Furthermore, by pressing the first bump 31 and the second bump 32, preferable bonding can be performed only by a load. In this case, as compared to the case where ultrasonic waves are applied, for example, all the pins of the sensor chip 10 can be pressed uniformly, so that preferable bonding can be performed. Note that substantially the same composition means elements or components which contain the same composition, and in which impurities can be suppressed to be low by bonding and a grain of a desired size can be formed.

It is shown that, since a region ROI4 in FIG. 4B is a region separated from the bonding interface JI1 by 2 µm or more downward, the second bump 32 is not affected by the pressing of the sensor chip 10 and a large grain is formed. For the second bump 32, for example, gold or copper can be used as a conductive member having substantially the same composition as the first bump 31. Since gold and copper are soft and easily deformed, the second bump 32 can be diffusion-joined at a low temperature and a low load. Furthermore, by pressing the second bump 32 and the first bump 31, preferable bonding can be performed only by a load. In this case, as compared to the case where ultrasonic waves are applied, for example, all the pins of the sensor chip 10 can be pressed uniformly, so that preferable bonding can be performed.

The SEM image of FIG. 4C shows a shape obtained by analyzing the surface structure of the bump unit 30 and pressing the bump unit 30. The SEM image shows that the top and bottom are evenly joined with the bonding interface JI1 in between.

Therefore, in order to perform stable bonding, for the thickness T1 of the first bump 31 and the thickness T2 of the second bump 32, it is desirable that each of a distance between the sensor chip 10 and the bonding interface JI1 and a distance between the wiring board 20 and the bonding interface JI1 is 2 µm or more. Furthermore, since the wiring board 20 has the glass base material 20a and has a smaller variation than a ceramic substrate, it is desirable that each of the thickness T1 of the first bump 31 and the T2 of the second bump 32 is within 50 µm (see FIG. 3).

FIGS. 5A, 5B, and 5C show a comparative example of a bonding cross section of a bump unit 30a formed including a first bump 31a of the sensor chip 10 and a second bump 32a of the wiring board 20. FIGS. 5A, 5B, and 5C show an analysis image of a bonding cross section of the bump unit 30a of the imaging apparatus 200 of the first embodiment as a comparative example. Unless otherwise specified, "up" means an upward direction in FIGS. 5A, 5B, and 5C, and "down" means a downward direction in FIGS. 5A, 5B, and 5C.

Note that, in FIGS. 5A, 5B, and 5C, FIG. 5A shows a cross-sectional view of the sensor chip 10 and the wiring board 20 before bonding, FIG. 5B shows an EBSP image of the sensor chip 10 and the wiring board 20 after bonding, and FIG. 5C shows an SEM image of the sensor chip 10 and the wiring board 20 after bonding. Note that the EBSP image in FIG. 5B is an image obtained by backscattered electron diffraction, and the SEM image in FIG. 5C is an image obtained by irradiating a sample with an electron beam and observing the surface.

FIG. 5A shows that the first bump 31a and the second bump 32a are formed as the bump unit 30a on the sensor chip 10. Furthermore, FIG. 5B shows an EBSP image in a state where the first bump 31a and the second bump 32a are joined.

It is shown that, at a joint interface JI2 in FIG. 5B, the first bump 31a and the second bump 32a are crushed and deformed by the pressing force at the time of joining the sensor chip 10a and the wiring board 20a, and stress is concentrated in the crushed region. It is shown that, grains are concentrated particularly at two bonding interfaces JI2. Furthermore, it is shown that, in a region ROI5, the grains are smaller and non-uniform as compared to the grains in the regions ROI3 and ROI4 in FIG. 4B.

A region ROI6 in FIG. 5B shows that the grain is coarse. For the pad 28, for example, a hard material such as nickel (Ni) or copper (Cu) is used. Therefore, the grain of the bump on the pad 28 side (that is, the second bump 32a) is coarse.

As described above, as the bump unit 30, both bumps formed on the sensor chip 10 and the wiring board 20 are suitable.

Next, the configurations of the sensor chip 10, the wiring board 20, the first bump 31, and the second bump 32 are shown in FIGS. 6A, 6B, 7A, 7B, and 7C. FIGS. 6A, 6B, 7A, 7B, and 7C are explanatory diagrams showing a configuration example of the imaging apparatus according to the first embodiment. Note that the same configuration as that of the imaging apparatus 200 of the first embodiment shown in FIG. 1 will be described using the same reference numerals, and the description thereof will be omitted as appropriate.

Figure 6A:
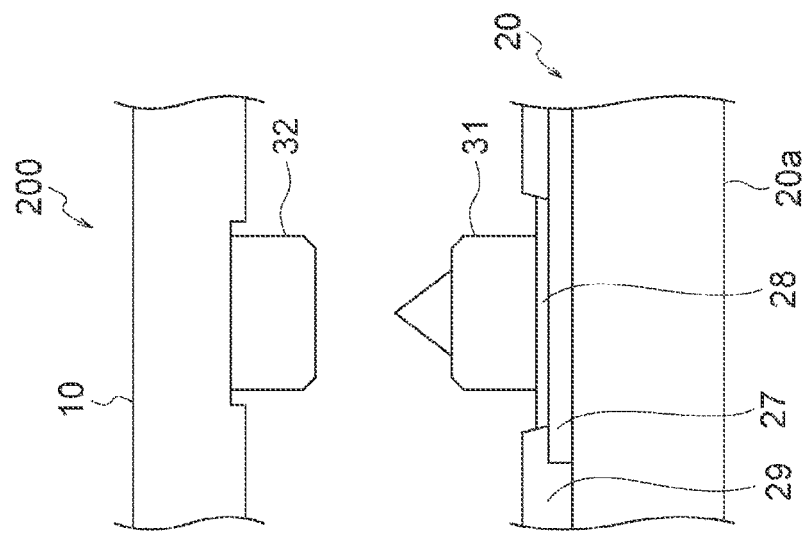
FIGS. 6A and 6B are explanatory diagrams showing a configuration example of the imaging apparatus of the first embodiment to which the present technology is applied.
Figure 6B:
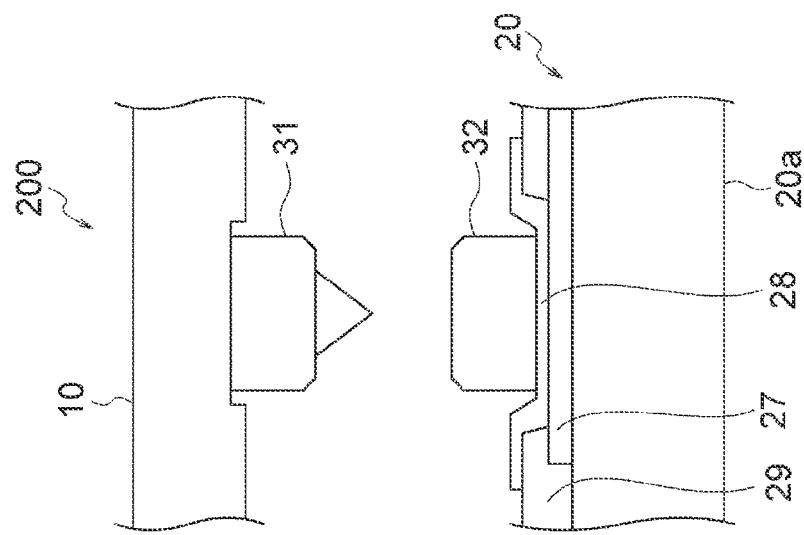

As shown in FIG. 6A, the first bump 31 is formed on the sensor chip 10. Furthermore, the second bump 32 is formed on the wiring board 20. Furthermore, as shown in FIG. 6B, the second bump 32 is formed on the sensor chip 10. Furthermore, the first bump 31 is formed on the wiring board 20. As described above, the bump unit 30 (see FIG. 3) need only be formed by the first bump 31 and the second bump 32, and the combination is not limited to the combination of the sensor chip 10 or the wiring board 20 and the first bump 31 or the second bump 32. Furthermore, either one or both of the first bump 31 and the second bump 32 may be subjected to flattering (flattened).

FIGS. 7A, 7B, and 7C are explanatory diagrams in which the combination of the first bump 31 and the second bump 32 shown in FIGS. 6A and 6B is applied to the wiring board 20. Note that the configurations of the metal wiring and the insulating layer are examples, and it is not limited thereto. Note that unless otherwise specified, "up" means an upward direction in FIGS. 7A, 7B, and 7C, and "down" means a downward direction in FIGS. 7A, 7B, and 7C. Note that FIGS. 7A, 7B, and 7C show a cross-sectional view of the imaging apparatus 200 of the first embodiment.

As shown on the upper side of FIG. 7A, the second bump 32 is formed on the sensor chip 10 and the first bump 31 is formed on a wiring board 20s. In the wiring board 20s, the metal wiring 27, the pad 28, and the insulating layer 29 are formed on the glass base material 20a. Furthermore, as shown on the lower side of FIG. 7A, the first bump 31 is formed on the sensor chip 10 and the second bump 32 is formed on the wiring board 20s. In the wiring board 20s, the metal wiring 27, the pad 28, and the insulating layer 29 are formed on the glass base material 20a.

As shown on the upper side of FIG. 7B, the second bump 32 is formed on the sensor chip 10 and the first bump 31 is formed on a wiring board 20t. In the wiring board 20t, a metal wiring 271, the pad 28, an insulating layer 291, and an insulating layer 292 are formed on the glass base material 20a. The metal wiring 271 is formed so that a part of the metal wiring 271 sandwiches the insulating layer 291 vertically. Furthermore, as shown on the lower side of FIG. 7B, the first bump 31 is formed on the sensor chip 10 and the second bump 32 is formed on the wiring board 20t. In the wiring board 20t, a metal wiring 271, the pad 28, an insulating layer 291, and an insulating layer 292 are formed on the glass base material 20a. The metal wiring 271 is formed so that a part of the metal wiring 271 sandwiches the insulating layer 291 vertically.

As shown on the upper side of FIG. 7C, the second bump 32 is formed on the sensor chip 10 and the first bump 31 is formed on a wiring board 20u. In the wiring board 20u, an insulating layer 291, the metal wiring 27, the pad 28, and an insulating layer 292 are formed on the glass base material 20a. Furthermore, as shown on the lower side of FIG. 7C, the first bump 31 is formed on the sensor chip 10 and the second bump 32 is formed on the wiring board 20u. In the wiring board 20u, an insulating layer 291, the metal wiring 27, the pad 28, and an insulating layer 292 are formed on the glass base material 20a.

As described above, the bump unit 30 (see FIG. 3) may include the first bump 31 and the second bump 32 formed on the sensor chip 10 and the wiring board 20 (20s, 20t, 20u).

Furthermore, in the imaging apparatus 200 of the first embodiment, since the wiring board 20 has the glass base material 20a, linear expansion coefficients of the sensor chip 10 and the wiring board 20 can be made uniform. For example, the linear expansion coefficients of the sensor chip 10 and the wiring board 20 can be made uniform at about 3 ppm/K at room temperature. Therefore, in the imaging apparatus 200 of the first embodiment, warpage control for absorbing the warp of the sensor chip 10 can be performed.

FIGS. 8A and 8B show the warp control for absorbing the warp of the sensor chip 10. FIGS. 8A and 8B are explanatory diagrams showing a state in which, in the imaging apparatus 200 of the first embodiment, warp of a sensor chip 10 is controlled.

In FIGS. 8A and 8B, FIG. 8A shows a state when the sensor chip 10 is mounted on the wiring board 20, and FIG. 8B shows a state after the sensor chip 10 is mounted on the wiring board 20.

For example, a diagonal length of the sensor chip 10 is set to 30 [mm], a temperature when the sensor chip 10 is mounted is set to 300 [° C.], and a temperature when the wiring board 20 is mounted is set to 200 [° C.]. The linear expansion coefficient of the silicon that forms the sensor chip 10 and the linear expansion coefficient of the glass base material of the wiring board 20 are both about 3 [ppm/]K, which is small compared to the linear expansion coefficient of general resins (about 13 [ppm/K]) and ceramic (about 7 [ppm/K]). Therefore, for example, even if the sensor chip 10 and the wiring board 20 are joined in a high temperature state, the absolute amount of expansion remains small. Specifically, the difference in the amount of expansion between the sensor chip 10 and the wiring board 20 is 4.5 [μm] when the diagonal length of the sensor chip 10 is 15 [mm], which is half of 30 [mm].

Here, a flat region L of the second bump 32 shown in FIG. 3 can be formed in the range of about 10 [μm] to about 30 [μm]. Therefore, in the imaging apparatus 200, the expansion and contraction of the sensor chip 10 and the wiring board 20 can be absorbed when the sensor chip 10 is mounted on the wiring board 20.

Therefore, in the imaging apparatus 200 of the first embodiment, the linear expansion can be absorbed even if the sensor chip 10 is mounted on the wiring board 20, so that the wiring board 20 can be assembled to the housing 120 with high accuracy.

3. Imaging Apparatus of Second Embodiment

An imaging apparatus of a second embodiment according to the present technology is an imaging apparatus in which at least one of the plurality of bumps is formed on an upper surface of the wiring board, and a laminated wiring layer including an insulating layer and a metal wiring layer may not be formed in a region of a lower surface of the wiring board facing the at least one of the plurality of bumps.

According to the imaging apparatus of the second embodiment according to the present technology, since the laminated wiring layer is not formed in the region substantially directly below the bump formed on the upper surface of the wiring board, it is possible to make the sensor chip follow the flatness of the glass base material, and the parallel accuracy at the time of mounting can be improved.

Figure 9:
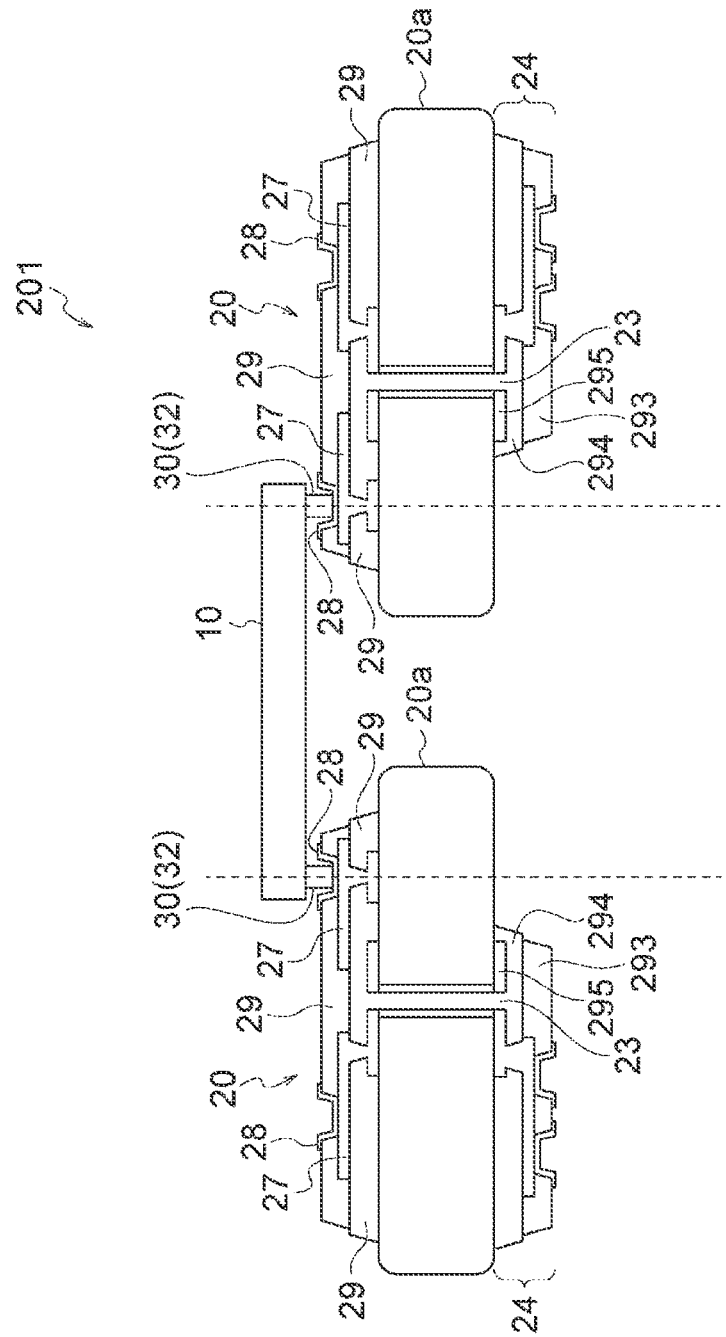
FIG. 9 is a cross-sectional view showing a configuration of an imaging apparatus of a second embodiment to which the present technology is applied.

FIG. 9 shows a configuration of the imaging apparatus of the second embodiment to which the present technology is applied. FIG. 9 is a cross-sectional view showing a configuration of the imaging apparatus according to the second embodiment to which the present technology is applied. Note that the same configuration as that of the imaging apparatus of the first embodiment will be described using the same reference numerals, and the description thereof will be omitted as appropriate. Note that unless otherwise specified, "up" means an upward direction in FIG. 9, and "down" means a downward direction in FIG. 9.

As shown in FIG. 9, in the imaging apparatus 201 of the second embodiment, at least one of the plurality of bumps (for example, the second bump 32 of the bump unit 30) is formed on the upper surface of the wiring board 20, and the laminated wiring layer 24 including an insulating layer and a metal wiring layer is not formed in a region of a lower surface of the wiring board 20 facing the at least one of the plurality of bumps (second bump 32).

In other words, it can be said that, in the imaging apparatus 201 of the second embodiment, the laminated wiring layer 24 is not formed in the region substantially directly below the second bump 32 formed on the upper surface of the wiring board 20. Note that the region substantially directly below is a region of the lower surface of the wiring board 20, includes at least a region directly below the second bump 32, and is a region located at a predetermined distance from directly below the region. Furthermore, it is assumed that the region substantially directly below includes a region of the lower surface of the wiring board 20 and in which the second bump 32 is located on the same line downward with respect to the wiring board 20.

First, in the glass base material 20a of the wiring board 20, the metal wiring 27, the pad 28, and the insulating layer 29 are formed on the surface on which the sensor chip 10 is provided. The glass base material 20a is connected to the sensor chip 10 via the pad 28 and the bump unit 30 (second bump 32). However, nothing is formed in a region that is a downward region of the bump unit 30 (second bump 32) and is of the lower surface of the wiring board 20.

The laminated wiring layer 24 is formed by an insulating layer 293, an insulating layer 294, and a wiring layer 295. The laminated wiring layer 24 is formed on the lower surface of the wiring board 20 on the right side of FIG. 9 and the lower surface of the wiring board 20 on the left side of FIG. 9.

Here, the parallelism between the sensor chip 10 and the wiring board 20 is determined by the parallelism accuracy when the sensor chip 10 is assembled to the wiring board 20 and the degree of flatness of the sensor chip 10. The region where the imaging apparatus 201 is most loaded is the region directly below the bump unit 30.

Therefore, in the imaging apparatus 200, by providing nothing in the region that faces the bump unit 30 and is of the lower surface of the glass base material 20a, the wiring board 20 can be supported following the degree of flatness of the glass base material 20a and the parallel accuracy at the time of mounting can be improved.

As described above, according to the imaging apparatus of the second embodiment according to the present technology, since the laminated wiring layer 24 is not formed in the region substantially directly below the bump formed on the upper surface of the wiring board, it is possible to make the sensor chip 10 follow the flatness of the glass base material 20a, and the parallel accuracy at the time of mounting can be improved.

4. Imaging Apparatus of Third Embodiment

An imaging apparatus of a third embodiment according to the present technology is an imaging apparatus in which at least one of the plurality of bumps is formed on an upper surface of the wiring board, and a laminated wiring layer including an insulating layer and a metal wiring layer is formed in a region of a lower surface of the wiring board facing the at least one of the plurality of bumps. In this case, for example, in the imaging apparatus, the laminated wiring layer is formed in at least two or more of the region, and layer configurations of wiring layers forming the laminated wiring layer formed in the two or more regions can be substantially the same.

According to the imaging apparatus of the third embodiment according to the present technology, the laminated wiring layer is formed in the region substantially directly below the bump formed on the upper surface of the wiring board, and layer configurations of the wiring layers forming the laminated wiring layers are substantially the same. Therefore, the imaging apparatus can maintain the flatness of the glass base material uniformly by the laminated wiring layer.

Figure 10:
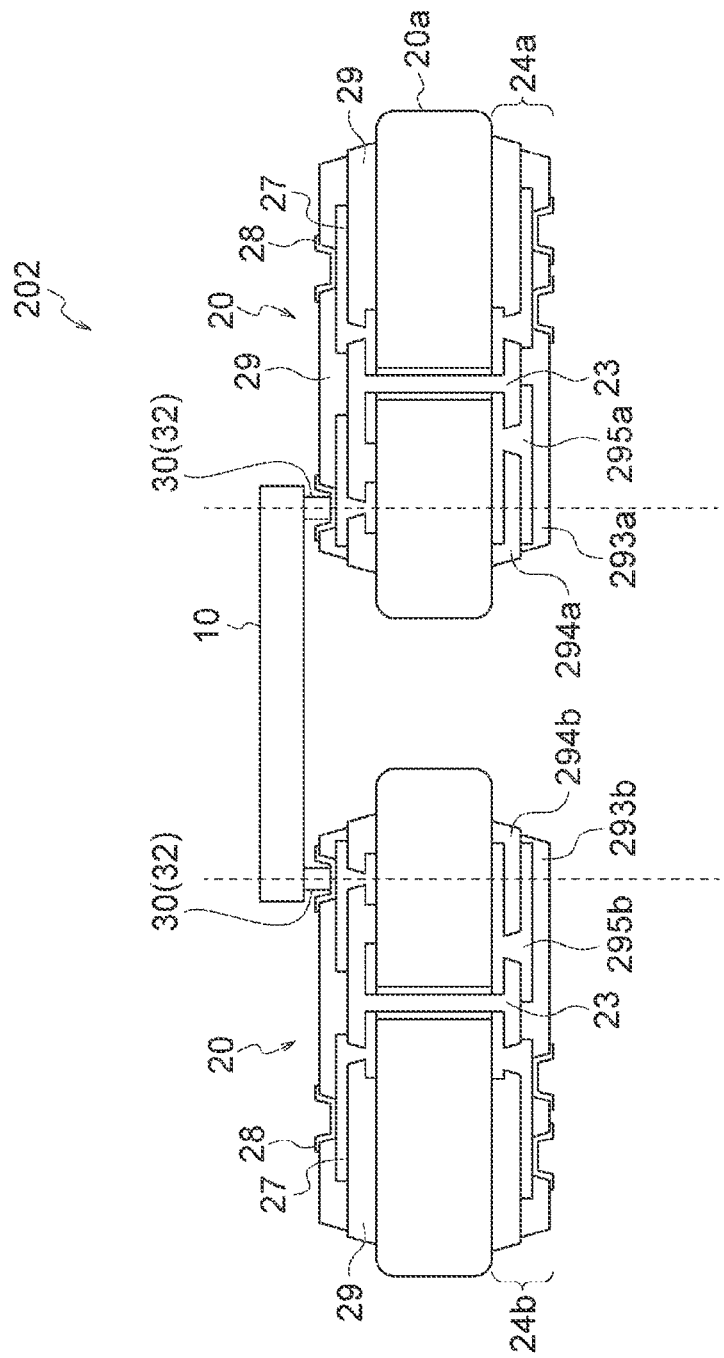
FIG. 10 is a cross-sectional view showing a configuration of an imaging apparatus of a third embodiment to which the present technology is applied.

FIG. 10 shows a configuration of the imaging apparatus of the third embodiment to which the present technology is applied. FIG. 10 is a cross-sectional view showing a configuration of the imaging apparatus according to the third embodiment to which the present technology is applied. Note that the same configuration as that of the imaging apparatus of the second embodiment will be described using the same reference numerals, and the description thereof will be omitted as appropriate. Unless otherwise specified, "right" means a right direction in FIG. 10, and "down" means a downward direction in FIG. 10.

As shown in FIG. 10, in an imaging apparatus 202 of the third embodiment, at least one of the plurality of bumps (for example, the second bump 32 of the bump unit 30) is formed on the upper surface of the wiring board 20, and the laminated wiring layers 24 (24a, 24b) including an insulating layer and a metal wiring layer are formed in a region of a lower surface of the wiring board 20 facing the at least one of the plurality of bumps (second bump 32).

In the imaging apparatus 202 of the third embodiment, the laminated wiring layers 24 (24a, 24b) are formed in at least two or more of the region, and layer configurations of wiring layers forming the laminated wiring layers 24 (24a, 24b) formed in the two or more regions are substantially the same. For example, the laminated wiring layer 24a on the right side of FIG. 10 is formed by an insulating layer 293a, an insulating layer 294a, and a wiring layer 295a. Furthermore, the laminated wiring layer 24b on the left side of FIG. 10 is formed by an insulating layer 293b, an insulating layer 294b, and a wiring layer 295b.

As described above, the laminated wiring layer 24a and the laminated wiring layer 24b have substantially the same layer configuration. Here, the term "substantially the same layer configuration" means, for example, a layer configuration in which the layer configurations include completely the same and the configurations of layers match by 90% or more.

In the imaging apparatus 202, by providing substantially the same laminated wiring layer 24a and laminated wiring layer 24b on the lower side of the glass base material 20a, the parallel accuracy at the time of mounting can be improved. Note that the imaging apparatus 202 of the third embodiment is not limited to the present embodiment.

Figure 11:
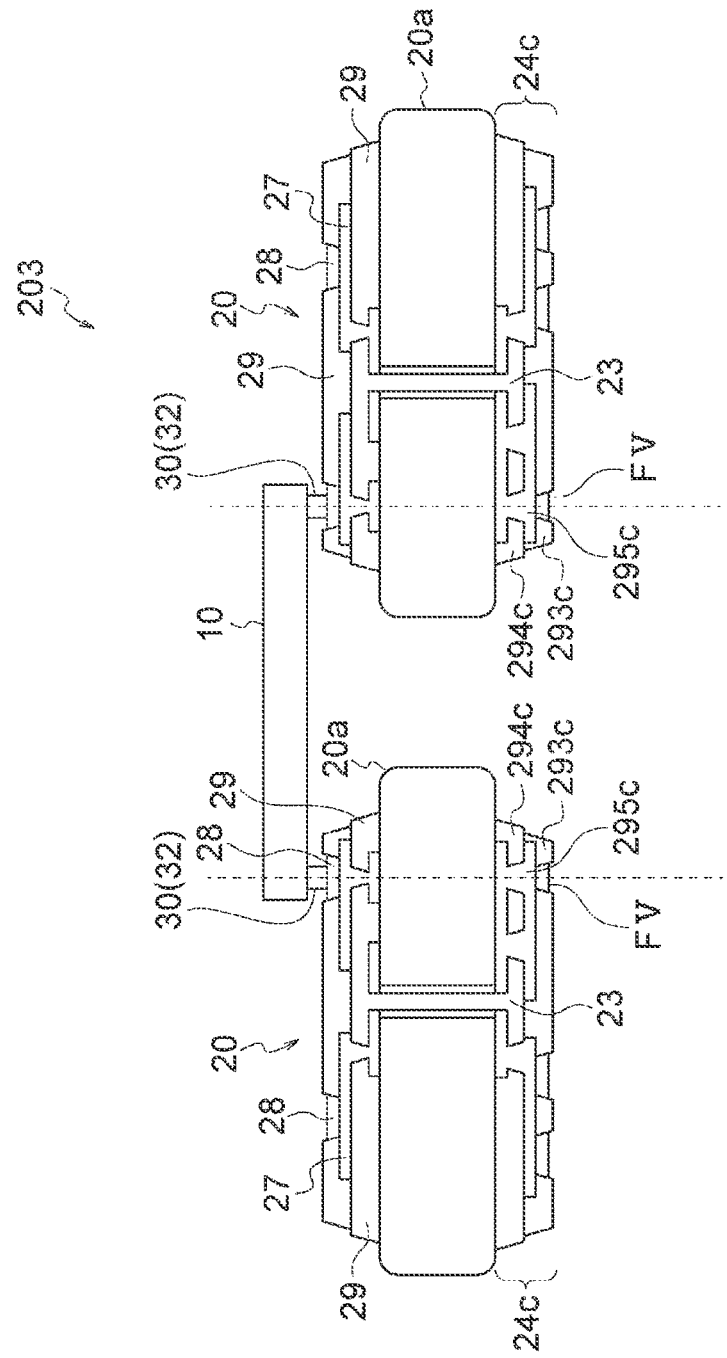
FIG. 11 is a cross-sectional view showing a modification of a configuration of the imaging apparatus of the third embodiment to which the present technology is applied.

FIG. 11 is a cross-sectional view showing a modification of a configuration of an imaging apparatus of the third embodiment to which the present technology is applied. FIG. 11 is a cross-sectional view showing a modification of a configuration of the imaging apparatus 203 of the third embodiment to which the present technology is applied. The modification of the configuration of the imaging apparatus 203 of the third embodiment is different from the configuration of the imaging apparatus 202 of the third embodiment in that the laminated wiring layer 24c has a structure in which a filled via is laminated. Note that since the components other than the laminated wiring layer 24c are the same as the imaging apparatus 202 of the third embodiment, the description thereof will be omitted.

The laminated wiring layer 24c is formed by laminating a filled via FV with an insulating layer 293c, an insulating layer 294c, and a wiring layer 295c. In the imaging apparatus 203 of the third embodiment, the load applied to the sensor chip 10 can be supported by the metal wiring 295c by laminating the filled via FV. In this case, in a part of the filled via, a metal is embedded in the metal wiring 295c as an interlayer connection via.

5. Imaging Apparatus of Fourth Embodiment

An imaging apparatus of a fourth embodiment according to the present technology further includes a protective member that protects the sensor chip, and in the imaging apparatus, the sensor chip is fixed between the protective member and the wiring board, an adhesive is arranged on the glass base material and the wiring layer of the wiring board, and the glass base material and the wiring layer of the wiring board are adhered to the protective member.

According to the imaging apparatus of the fourth embodiment according to the present technology, the wiring board having the glass base material can be used as an assembly reference surface. Therefore, in the imaging apparatus of the fourth embodiment, the glass base material and the wiring layer of the wiring board are adhered to the protective member, so that the laminated wiring layer can be prevented from peeling off.

Figure 12:
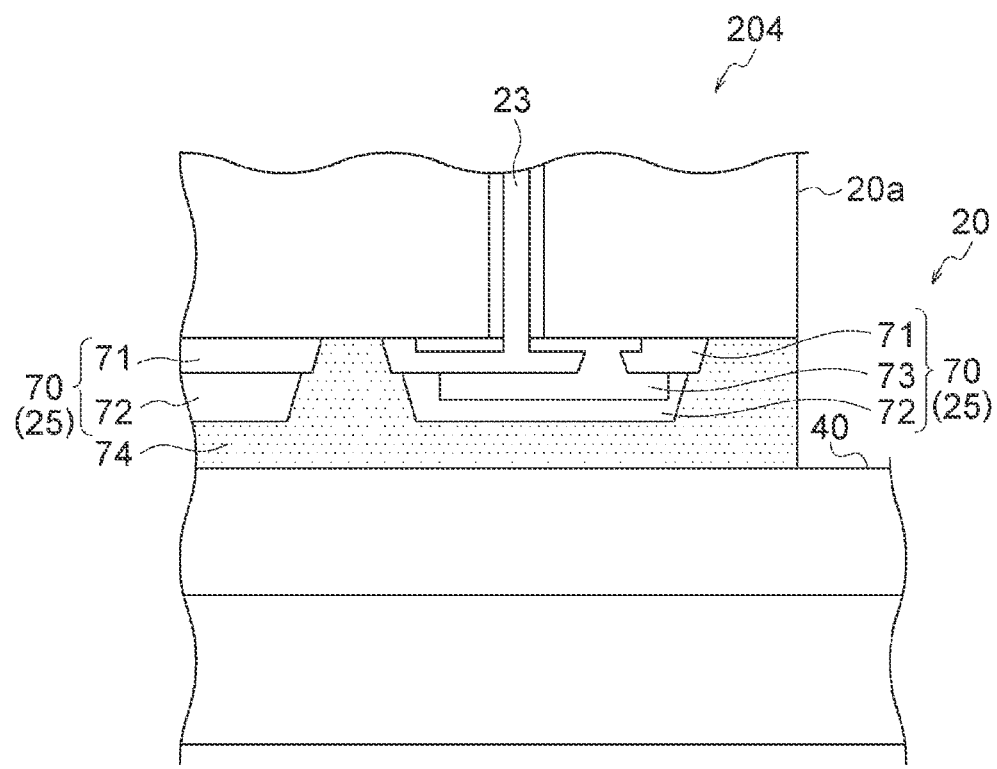
FIG. 12 is a cross-sectional view showing a configuration of an imaging apparatus according to a fourth embodiment to which the present technology is applied.

FIG. 12 shows a configuration of the imaging apparatus of the fourth embodiment to which the present technology is applied. FIG. 12 is a cross-sectional view showing a configuration of the imaging apparatus according to the fourth embodiment to which the present technology is applied. Note that the same configuration as that of the imaging apparatus of the first embodiment will be described using the same reference numerals, and the description thereof will be omitted as appropriate.

The imaging apparatus 204 of the fourth embodiment includes the protective member 40 that protects the sensor chip 10 as similar to the imaging apparatus 200 of the first embodiment. In the imaging apparatus 204, the sensor chip 10 is fixed between the protective member 40 and the wiring board 20. In the imaging apparatus 204, the adhesive 74 is arranged on the glass base material 20a and a laminated wiring layer 70 (25) of the wiring board 20, and the glass base material 20a and the laminated wiring layer 70 (25) of the wiring board 20 are adhered to the protective member 40.

The protective member 40 is a protective member for protecting the sensor chip 10. The protective member 40 may have a lid shape in order to protect the sensor chip 10, for example. The protective member 40 may be formed by, for example, a metal, a resin, carbon, or the like, or may be a member in which a metal and a resin are composited. Specifically, copper (Cu), aluminum (Al), and alloys such as molybdenum copper alloy (CuMo), nickel-iron alloy (FeNi), and steel use stainless (SUS) can be applied as the metal. Furthermore, copper (Cu), invar (iron alloy), copper (Cu) clad material, and the like can also be applied. Molding materials, carbon fiber reinforced plastics (CFRP), glass, and the like can be applied as the resin. Furthermore, a composite member in which a molding material and a copper (Cu) plate are joined to each other can be applied as a member in which a metal and a resin are composited.

The laminated wiring layer 70 (25) is formed by the insulating layer 71, the insulating layer 72, and the metal wiring layer 73 depending on the region to be formed. Furthermore, the laminated wiring layer 70 (25) may be formed including the insulating layer 71 and the insulating layer 72 depending on the region to be formed.

As the adhesive 74, a silicone-based resin, an epoxy-based resin, an acrylic-based resin, or the like can be applied as an adhesive for adhering the wiring board 20 and the protective member 40. Furthermore, by using a black material that does not transmit visible light as the color of the adhesive 74, unnecessary light from the outside can be blocked. Furthermore, as an adhesive for adhering the mold material and the metal plate, a silicone-based resin, an epoxy-based resin, an acrylic-based resin, or the like can be applied. Furthermore, in a case of bonding glass and mold material, by using an epoxy resin, even in a case where there is a large difference in thermal expansion coefficient between glass and mold material, thermal stress can be reduced by adjusting the thermal expansion coefficient of the mold material.

Therefore, in the imaging apparatus 204 of the fourth embodiment according to the present technology, the wiring board 20 having the glass base material 20a can be used as an assembly reference surface. Furthermore, in the imaging apparatus 204 of the fourth embodiment, the glass base material 20a and the laminated wiring layer 70 (25) of the wiring board 20 are adhered to the protective member 40, so that the laminated wiring layer 70 (25) can be prevented from peeling off.

6. Imaging Apparatus of Fifth Embodiment

The imaging apparatus of a fifth embodiment according to the present technology is an imaging apparatus in which a cushioning material is arranged between the sensor chip and the protective member.

According to the imaging apparatus of the fifth embodiment according to the present technology, since the imaging apparatus has a cushioning material arranged between the sensor chip and the protective member, the vibration or impact generated in the protective member can be prevented from being transmitted to the sensor chip.

Figure 13:
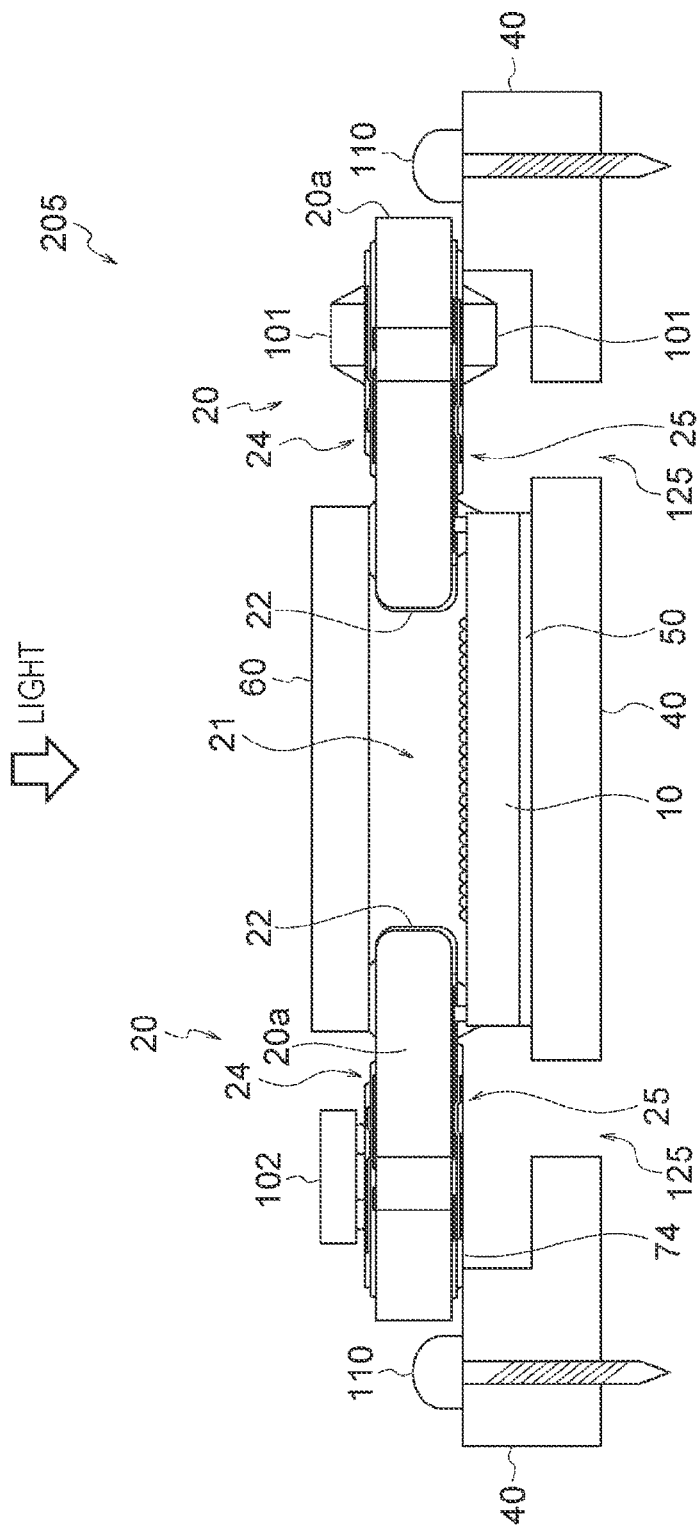
FIG. 13 is a cross-sectional view showing a configuration of an imaging apparatus of a fifth embodiment to which the present technology is applied.

FIG. 13 shows a configuration of an imaging apparatus 205 of the fifth embodiment to which the present technology is applied. FIG. 13 is a cross-sectional view showing a configuration of the imaging apparatus 205 according to the fifth embodiment to which the present technology is applied. Note that the same configuration as that of the imaging apparatus 200 of the first embodiment will be described using the same reference numerals, and the description thereof will be omitted as appropriate.

As shown in FIG. 13, in the imaging apparatus 205 of the fifth embodiment, a cushioning material 50 that prevents the sensor chip 10 and the protective member 40 from interfering with each other is arranged between the sensor chip 10 and the protective member 40. A silicone-based resin can be applied as the cushioning material 50. Furthermore, the cushioning material 50 may be hollow.

Therefore, in the imaging apparatus 205 of the fifth embodiment according to the present technology, since the imaging apparatus 205 has the cushioning material 50 arranged between the sensor chip 10 and the protective member 40, the vibration or impact generated in the protective member 40 can be prevented from being transmitted to the sensor chip 10, for example.

7. Imaging Apparatus of Sixth Embodiment

The imaging apparatus of the sixth embodiment according to the present technology is an imaging apparatus in which a protective member is fixed to a housing that accommodates the sensor chip.

According to the imaging apparatus of the sixth embodiment according to the present technology, since the protective member is fixed to the housing that accommodates the sensor chip, the sensor chip can be assembled to the housing with high accuracy.

Figure 14:
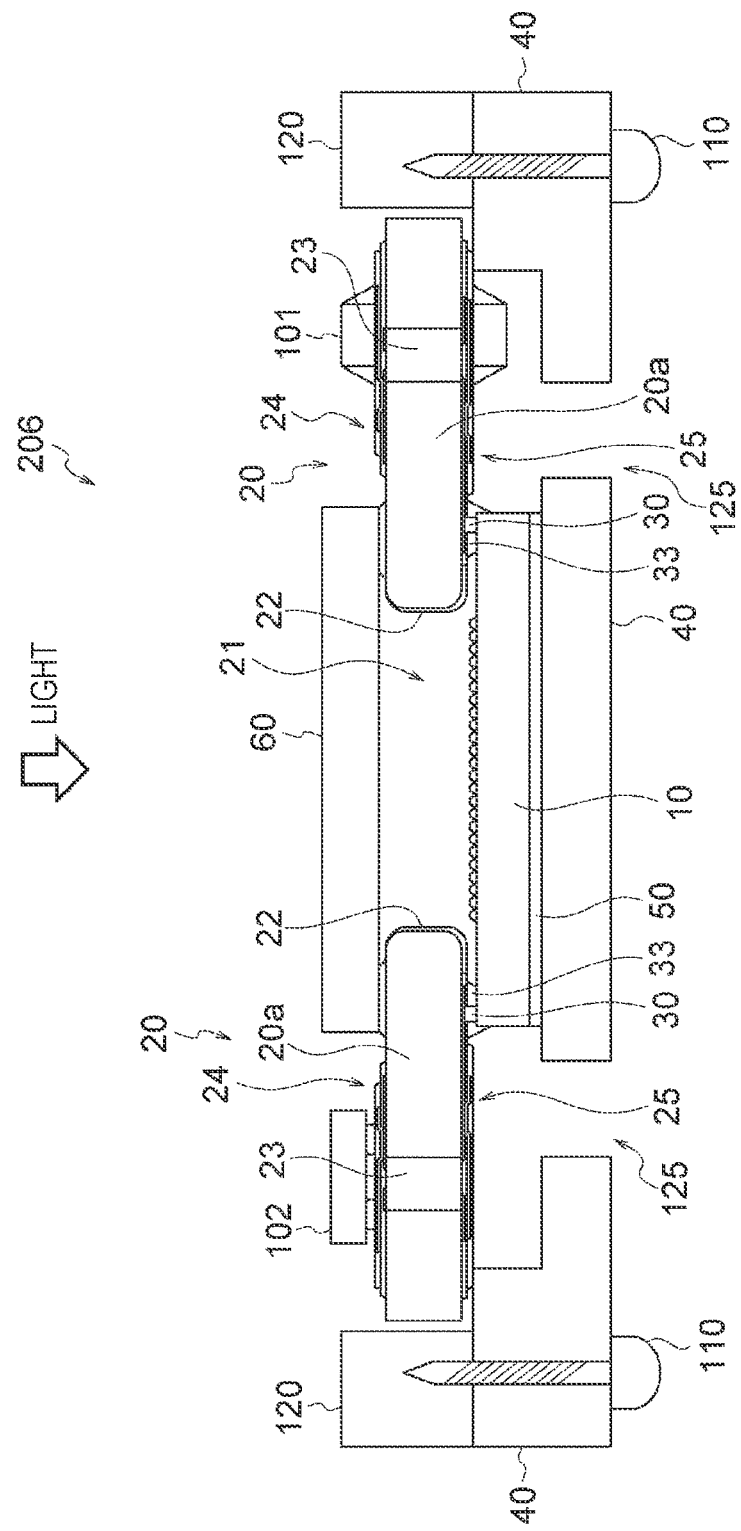
FIG. 14 is a cross-sectional view showing a configuration of an imaging apparatus of a sixth embodiment to which the present technology is applied.

FIG. 14 shows a configuration of an imaging apparatus 206 of the sixth embodiment to which the present technology is applied. FIG. 14 is a cross-sectional view showing a configuration of the imaging apparatus 206 according to the sixth embodiment to which the present technology is applied. Note that the same configuration as that of the imaging apparatus 200 of the first embodiment will be described using the same reference numerals, and the description thereof will be omitted as appropriate.

As shown in FIG. 14, in the imaging apparatus 206 of the sixth embodiment, the protective member 40 is fixed to the housing 120 that accommodates the sensor chip 10. Furthermore, the wiring board 20 is assembled to the housing 120.

As described above, in the imaging apparatus 206 of the sixth embodiment according to the present technology, the protective member 40 protects the sensor chip 10, and the protective member 40 and the wiring board 20 are assembled to the housing 120. Therefore, the imaging apparatus 206 can maintain the state in which the sensor chip 10 is assembled to the housing 120 with high accuracy.

8. Imaging Apparatus of Seventh Embodiment

The imaging apparatus of the seventh embodiment according to the present technology includes a sensor chip, a wiring board having a glass base material, and a protective member that protects the sensor chip, and in the imaging apparatus, an adhesive is arranged on the glass base material and a wiring layer of the wiring board, and the glass base material and the wiring layer of the wiring board are adhered to the protective member.

According to the imaging apparatus of the seventh embodiment according to the present technology, the wiring board having the glass base material can be used as an assembly reference surface. Therefore, in the imaging apparatus of the seventh embodiment, the glass base material and the wiring layer of the wiring board are adhered to the protective member, so that the laminated wiring layer can be prevented from peeling off.

Figure 15:
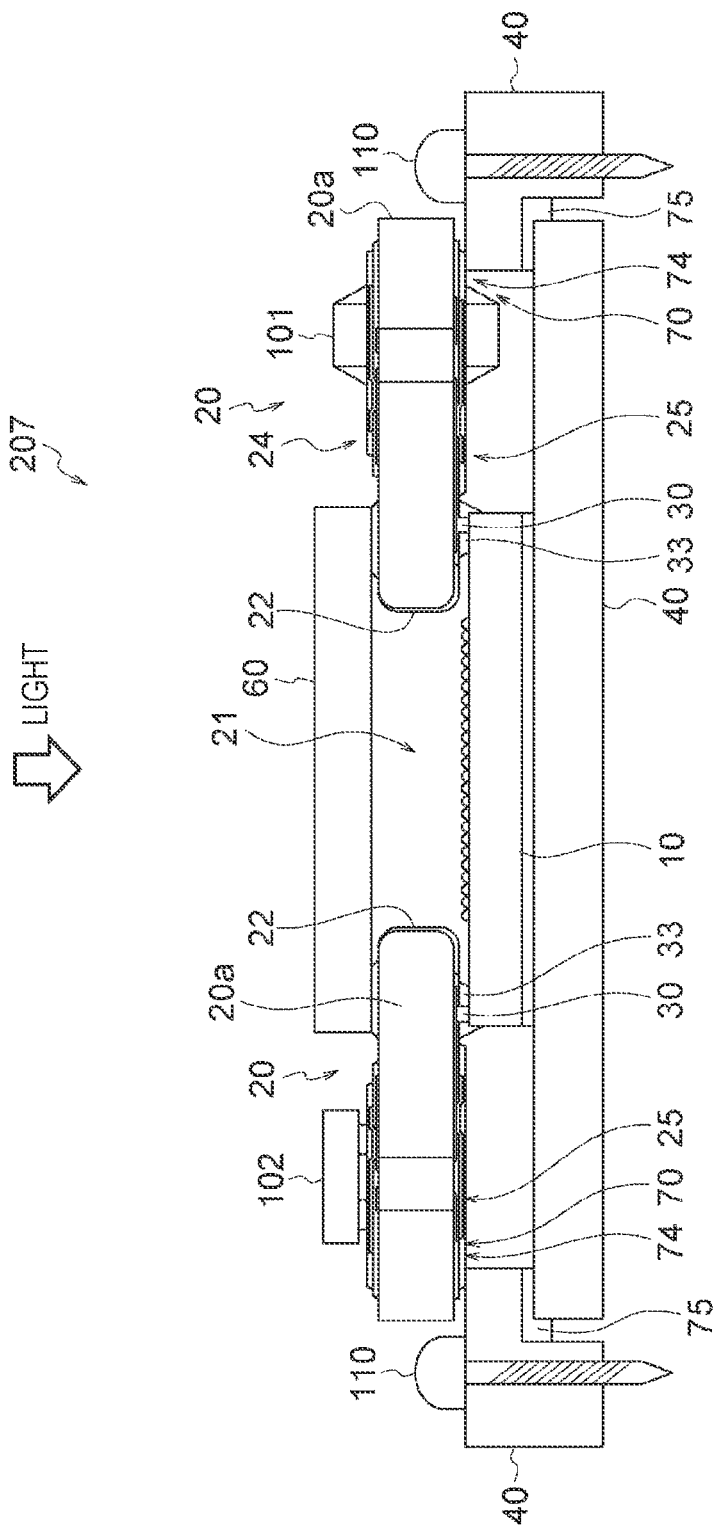
FIG. 15 is a cross-sectional view showing a configuration of an imaging apparatus of a seventh embodiment to which the present technology is applied.

FIG. 15 shows a configuration of an imaging apparatus 207 of the seventh embodiment to which the present technology is applied. FIG. 15 is a cross-sectional view showing a configuration of the imaging apparatus 207 according to the seventh embodiment to which the present technology is applied. Note that the same configuration as that of the imaging apparatus 200 of the first embodiment will be described using the same reference numerals, and the description thereof will be omitted as appropriate.

As shown in FIG. 15, the imaging apparatus 207 of the seventh embodiment includes the sensor chip 10, the wiring board 20 having the glass base material 20a, and the protective member 40 that protects the sensor chip 10, and in the imaging apparatus 207, the adhesive 74 is arranged on the glass base material 20a and the laminated wiring layer 70 of the wiring board 20, and the glass base material 20a and the laminated wiring layer 70 of the wiring board 20 are adhered to the protective member 40.

Since the adhesive 74 is arranged on the glass base material 20a and the laminated wiring layer 70, the adhesive 74 may be arranged on the outer edge of the wiring board 20.

Figure 16:
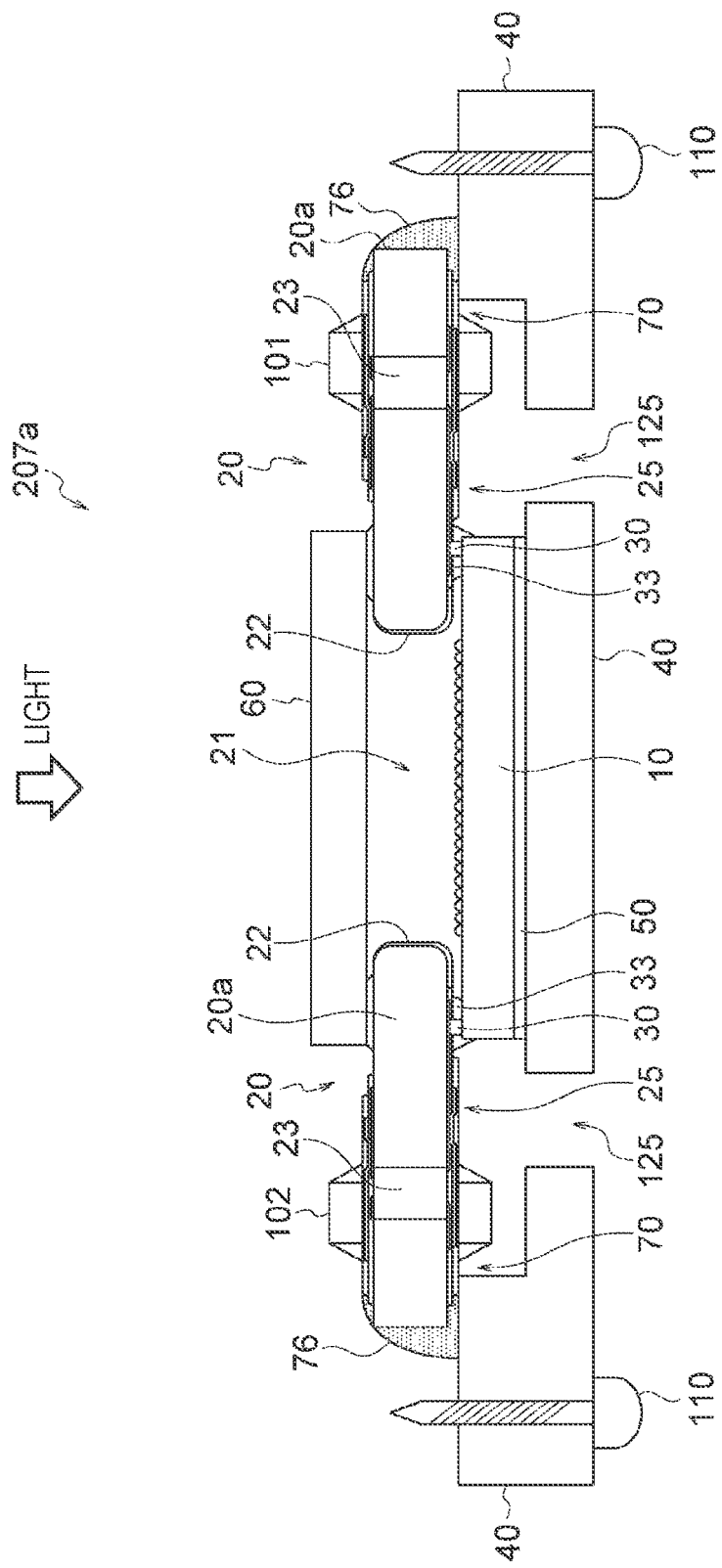
FIG. 16 is a cross-sectional view showing a modification of a configuration of the imaging apparatus of the seventh embodiment to which the present technology is applied.

FIG. 16 shows a modification of a configuration of an imaging apparatus of the seventh embodiment. FIG. 16 is a cross-sectional view showing a modification of a configuration of an imaging apparatus of the seventh embodiment. Note that the same configuration as that of an imaging apparatus 207a of the seventh embodiment will be described using the same reference numerals, and the description thereof will be omitted as appropriate.

As shown in FIG. 16, in the imaging apparatus 207a of the seventh embodiment, the adhesive 76 is arranged on the glass base material 20a and the laminated wiring layer 70 of the wiring board 20. The glass base material 20a and the laminated wiring layer 70 of the wiring board 20 are adhered to the protective member 40.

Since the adhesive 76 is arranged on the glass base material 20a and the laminated wiring layer 25, the adhesive 76 may be arranged on the outer edge of the wiring board 20. Since being arranged on the outer edge of the wiring board 20, the adhesive 76 can also protect the side wall of the glass base material 20a.

Figure 17A:
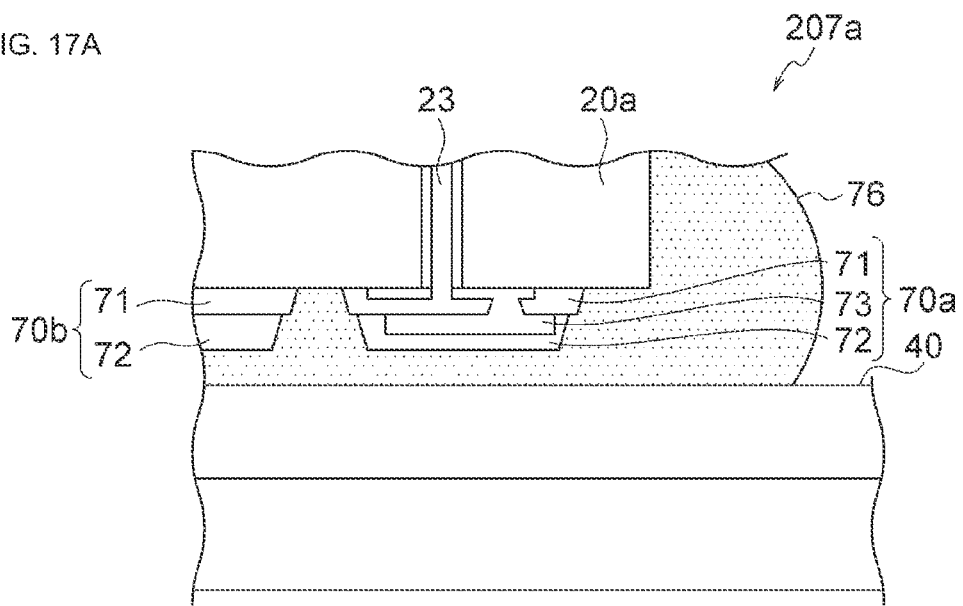
FIGS. 17A and 17B are partially enlarged views of an enlarged portion of an adhesive portion of the imaging apparatus of the seventh embodiment to which the present technology is applied.
Figure 17B:
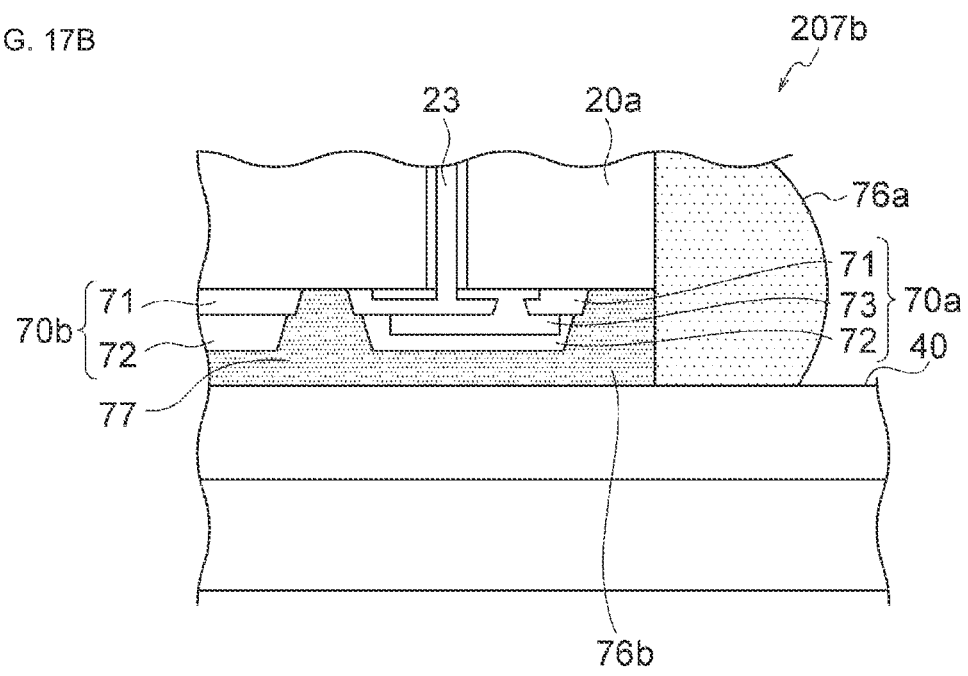

FIGS. 17A and 17B show a partially enlarged view of the bonding portion between the glass base material 20a and the protective member 40. FIGS. 17A and 17B are partially enlarged view of an enlarged portion of an adhesive portion of an imaging apparatus 207a of the seventh embodiment to which the present technology is applied. In FIGS. 17A and 17B, FIG. 17A shows a case where the adhesive 76 is formed by one kind of adhesive, and FIG. 17B shows a case where the adhesive 76 is formed by two kinds of adhesives.

As shown in FIG. 17A, the adhesive 76 is arranged on the glass base material 20a and the laminated wiring layer 70 (70a, 70b) of the wiring board 20. The laminated wiring layer 70a is formed including the insulating layer 71, the insulating layer 72, and the metal wiring layer 73 depending on the region to be formed. Furthermore, the wiring layer laminated wiring layer 70b is formed including the insulating layer 71 and the insulating layer 72 depending on the region to be formed.

Furthermore, as shown in FIG. 17B, the adhesive 76a is arranged on the side surface of the glass base material 20a, and is arranged up to the protective member 40. The adhesive 76b is arranged on the glass base material 20a and the laminated wiring layer 70 (70a, 70b). The adhesive 76b adheres the glass base material 20a and the laminated wiring layer 70 (70a, 70b) to the protective member 40. The laminated wiring layer 70a is formed including the insulating layer 71, the insulating layer 72, and the metal wiring layer 73 depending on the region to be formed. Furthermore, the laminated wiring layer 70b is formed including the insulating layer 71 and the insulating layer 72 depending on the region to be formed.

As described above, in the imaging apparatus 207a of the seventh embodiment, the adhesive 76 may be formed by one kind of adhesive, and the adhesive 76 may be formed by two kinds of adhesives (76a, 76b). In this case, by using a black material that does not transmit visible light as the adhesive 76a, unnecessary light from the outside can be blocked.

Furthermore, a material having a high adhesive force between the glass base material 20a and the laminated wiring layer 70 (70a, 70b) can be used as the adhesive 76b. Furthermore, a black material that does not transmit visible light can be used also for the adhesive 76.

Figure 18:
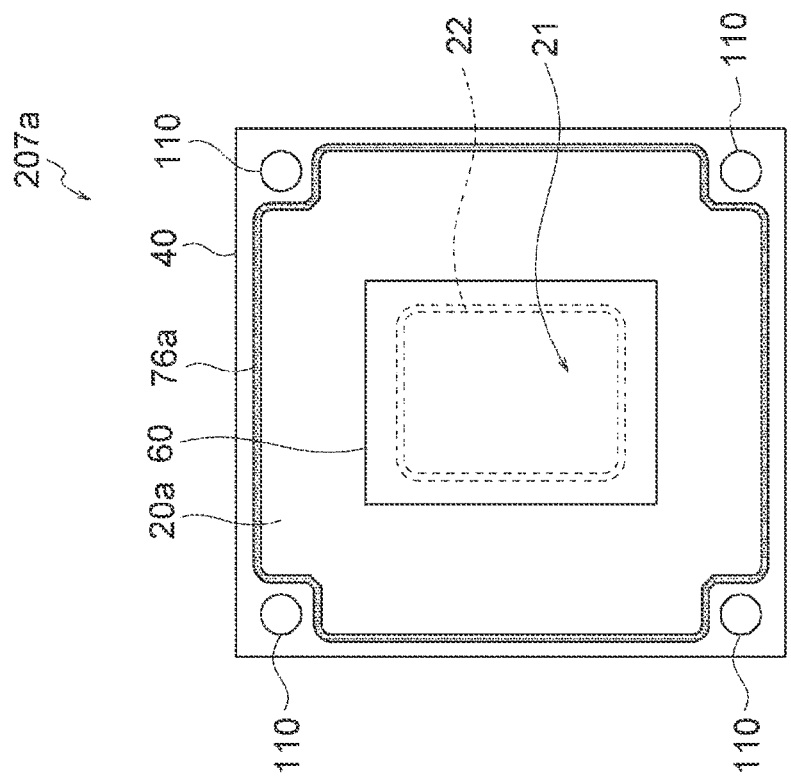
FIG. 18 is a top view showing an adhesive portion of an adhesive of the imaging apparatus of the seventh embodiment to which the present technology is applied.

FIG. 18 shows a top view showing the bonding portion of the adhesive 76a of the imaging apparatus 207a of the seventh embodiment. FIG. 18 is a top view showing the bonding portion of the adhesive 76a of the imaging apparatus 207a of the seventh embodiment. Note that the same configuration as that of the imaging apparatus 200 of the first embodiment will be described using the same reference numerals, and the description thereof will be omitted as appropriate.

As shown in FIG. 18, the adhesive 76a is arranged so as to cover between the glass base material 20a and the protective member 40 along the shape of the glass base material 20a. Therefore, the adhesive 76a can block unnecessary light from the outside by using the black material.

9. Imaging Apparatus of Eighth Embodiment

The imaging apparatus of the eighth embodiment according to the present technology includes a sensor chip and a wiring board having a glass base material, and the sensor chip and the wiring board are joined via a bump unit, and the imaging apparatus further includes a cover glass.

According to the imaging apparatus of the eighth embodiment according to the present technology, at least a part of the cover glass is adhered to the glass base material 20a of the wiring board 20 as similar to the protective member of the imaging apparatus of the fourth embodiment, so that the parallelism of the cover glass can be increased.

Figure 19:
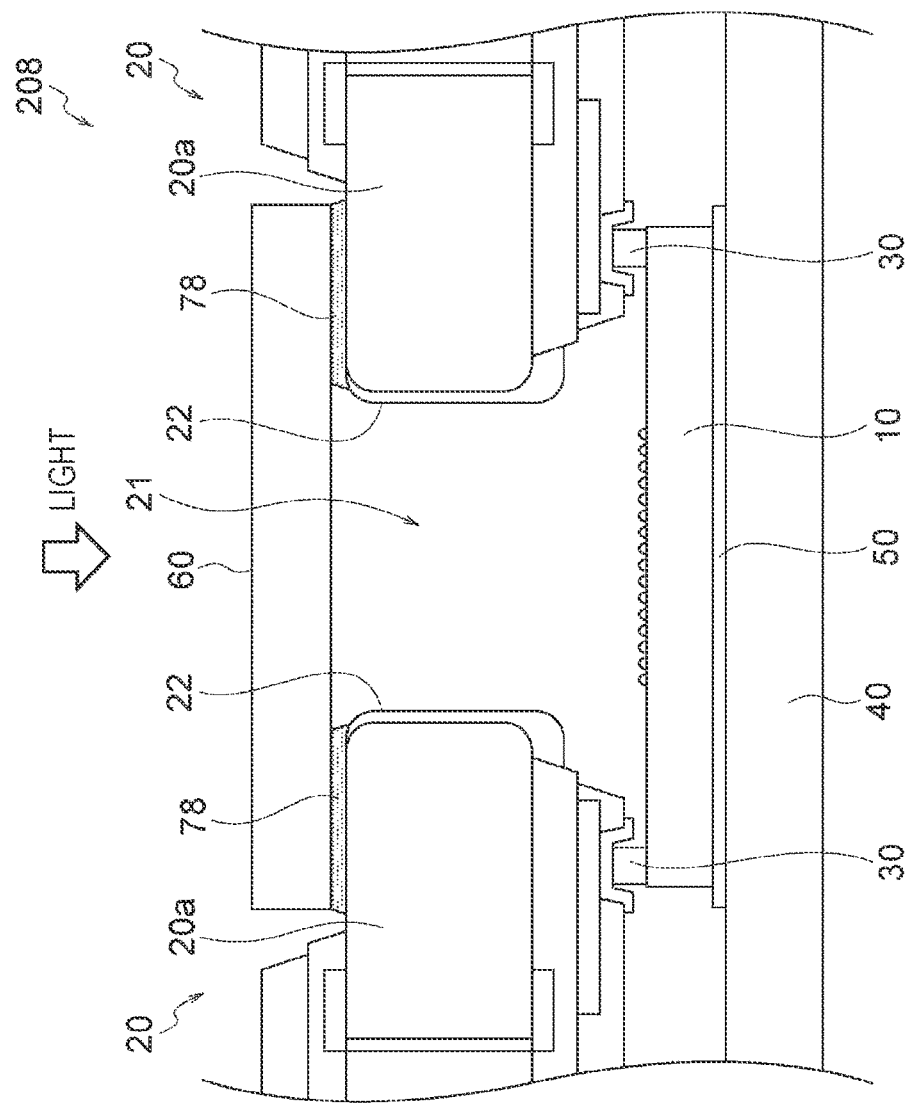
FIG. 19 is a cross-sectional view showing a configuration of an imaging apparatus of an eighth embodiment to which the present technology is applied.

FIG. 19 shows a configuration of an imaging apparatus 208 of the eighth embodiment to which the present technology is applied. FIG. 19 is a cross-sectional view showing a configuration of the imaging apparatus 208 according to the eighth embodiment to which the present technology is applied. Note that the same configuration as that of the imaging apparatus 200 of the first embodiment will be described using the same reference numerals, and the description thereof will be omitted as appropriate. Unless otherwise specified, "right" means a right direction in FIG. 19, and "down" means a downward direction in FIG. 19.

As shown in FIG. 19, the imaging apparatus 208 of the eighth embodiment further includes the cover glass 60 on the upper side of the glass base material 20a. In the imaging apparatus 208, an adhesive 78 is arranged between the cover glass 60 and the glass base material 20a, and the cover glass 60 and the glass base material 20a are adhered to each other.

Since the cover glass 60 has high parallelism together with the glass base material 20a, the parallelism of the cover glass 60 can be enhanced by being adhered along the glass base material 20a.

Figure 20:
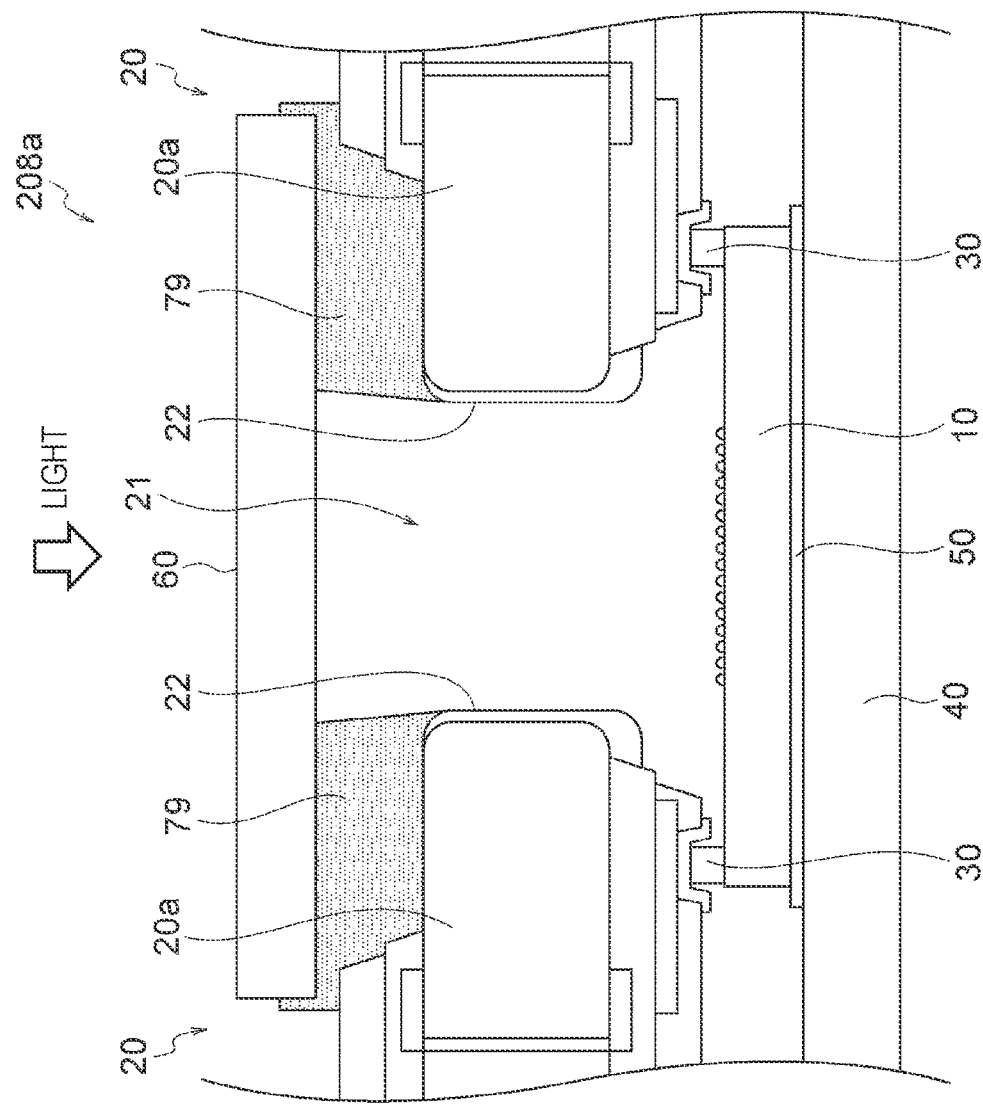
FIG. 20 is a cross-sectional view showing a modification of a configuration of the imaging apparatus of the eighth embodiment to which the present technology is applied.

FIG. 20 shows a modification of a configuration of an imaging apparatus of the eighth embodiment. FIG. 20 is a cross-sectional view showing a modification of a configuration of an imaging apparatus of the eighth embodiment. Note that the same configuration as that of the imaging apparatus 208 of the eighth embodiment will be described using the same reference numerals, and the description thereof will be omitted as appropriate.

As shown in FIG. 20, the imaging apparatus 208a of the eighth embodiment further includes the cover glass 60 on the upper side of the glass base material 20a as similar to the imaging apparatus 208. In the imaging apparatus 208a, an adhesive 79 is arranged between the cover glass 60 and the glass base material 20a, and the cover glass 60 and the glass base material 20a are adhered to each other.

The adhesive 79 is arranged so that the thickness of the adhesive is larger than that of the adhesive 78. By increasing the thickness of the adhesive according to the distance between the cover glass 60 and the glass base material 20a, the adhesive 79 can be adhered by adjusting the height while maintaining the parallelism with the glass base material 20a.

As described above, in the imaging apparatus 208 (208a) of the eighth embodiment, at least a part of the cover glass is adhered to the glass base material 20a of the wiring board 20, so that the parallelism of the cover glass can be increased.

10. Imaging Apparatus of Ninth Embodiment

An imaging apparatus of a ninth embodiment according to the present technology is the imaging apparatus of the first embodiment further including a control board connected to the wiring board and a connector for connecting the wiring board and the control board.

According to the imaging apparatus of the ninth embodiment according to the present technology, since the control board is directly connected to the wiring board via the connector, the sensor chip assembled to the housing with high accuracy can be controlled.

Figure 21:
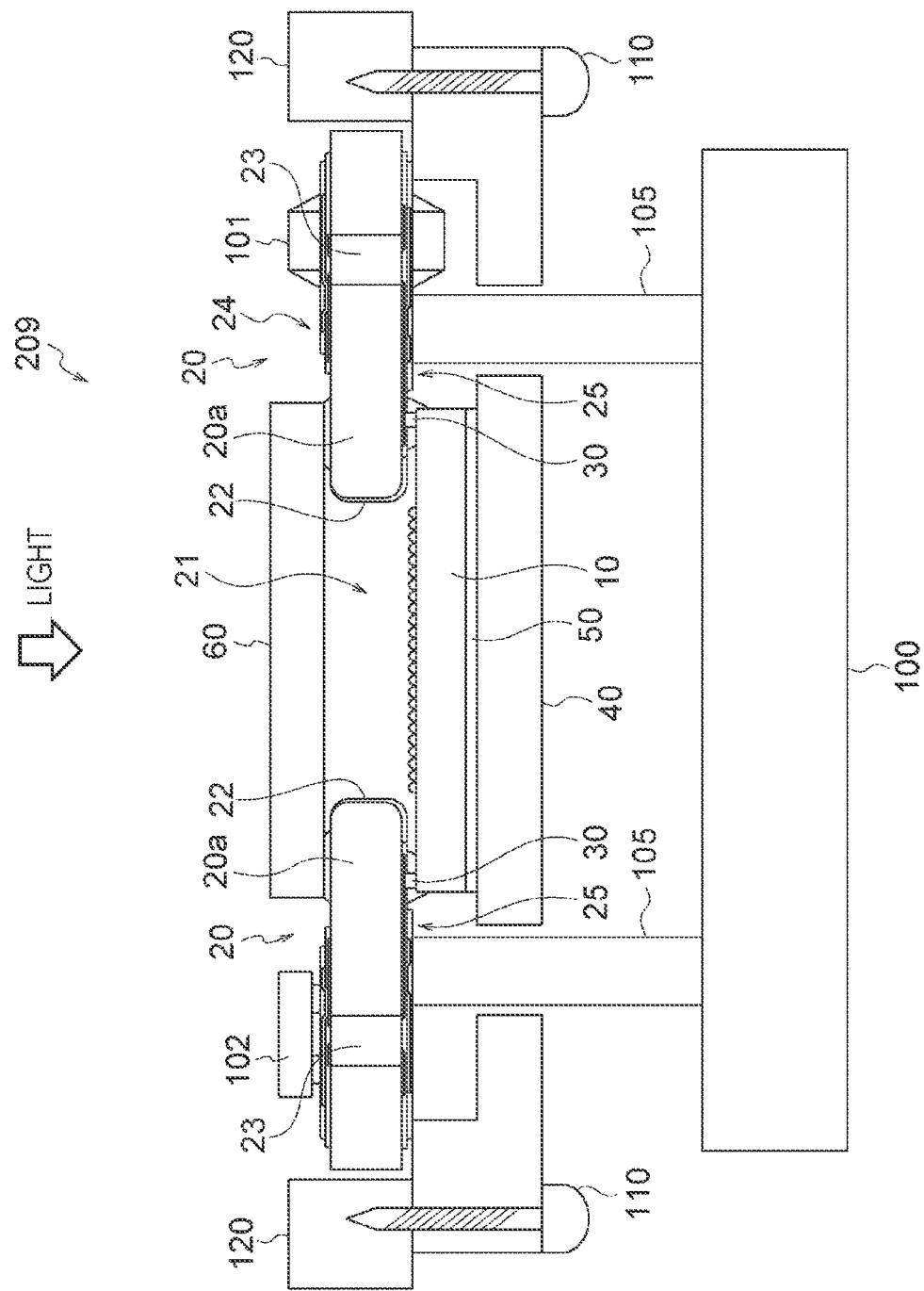
FIG. 21 is a cross-sectional view showing a configuration of an imaging apparatus of a ninth embodiment to which the present technology is applied.

FIG. 21 shows a configuration of an imaging apparatus 209 of the ninth embodiment to which the present technology is applied. FIG. 21 is a cross-sectional view showing a configuration of the imaging apparatus 209 according to the ninth embodiment to which the present technology is applied. Note that the same configuration as that of the imaging apparatus 200 of the first embodiment will be described using the same reference numerals, and the description thereof will be omitted as appropriate.

As shown in FIG. 21, in the imaging apparatus 209 of the ninth embodiment, the laminated wiring layer 25 and the control board 100 are connected via the connector 105. The control board 100 is connected to the sensor chip 10 via the connector 105 and the laminated wiring layer 25 of the wiring board 20.

Since the control board 100 can directly control the sensor chip 10, it is possible to perform image processing on a high-definition captured image acquired by the sensor chip 10 assembled to the housing 120 with high accuracy.

Figure 22A:
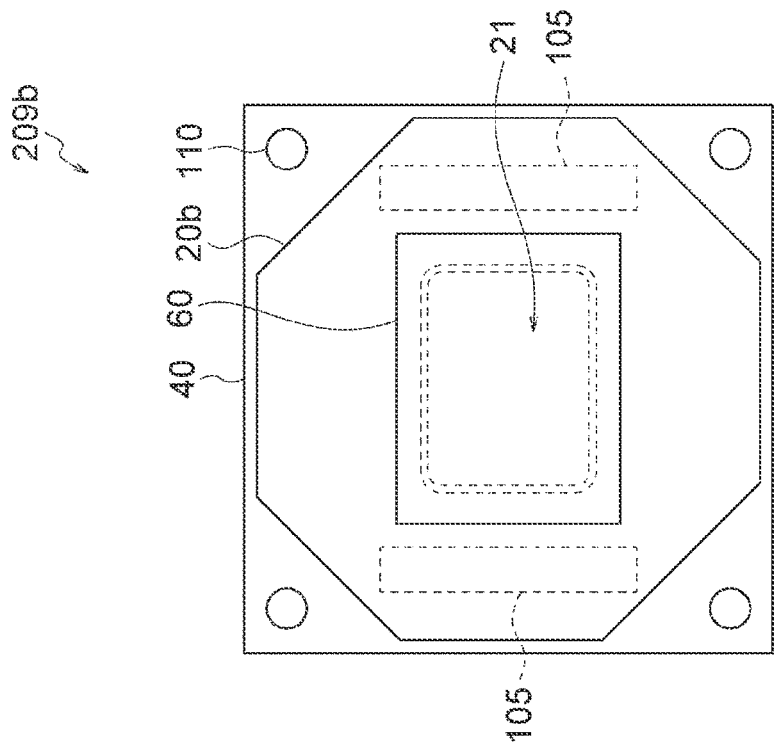
FIGS. 22A and 22B are examples top view showing a configuration of the imaging apparatus of the ninth embodiment to which the present technology is applied.
Figure 22B:
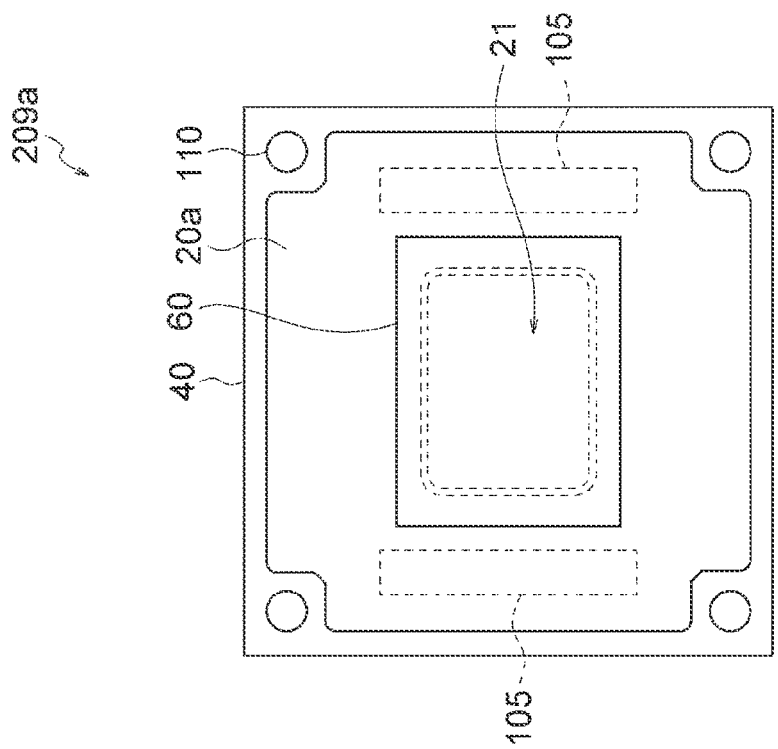

FIGS. 22A and 22B show an example top view of the configuration of the imaging apparatus according to the ninth embodiment. FIGS. 22A and 22B are examples top view showing a configuration of the imaging apparatus according to the ninth embodiment to which the present technology is applied. Note that the same configuration as that of the imaging apparatus 200 of the first embodiment will be described using the same reference numerals, and the description thereof will be omitted as appropriate. In FIGS. 22A and 22B, FIG. 22A shows a top view of the shape of the glass base material 20a, and FIG. 22B shows a top view of the shape of the glass base material 20b.

As shown in FIG. 22A, it is shown that, in the imaging apparatus 209a of the ninth embodiment, the connector 105 is connected to the glass base material 20a. As shown in FIG. 22B, it is shown that, in the imaging apparatus 209b of the ninth embodiment, the connector 105 is connected to the glass base material 20b. The difference of FIGS. 22A and 22B from the top view of the imaging apparatus 200 of the first embodiment (see FIGS. 2A and 2B) is that the connector 105 is connected.

As described above, in the imaging apparatus 209 of the ninth embodiment, since the control board 100 is directly connected to the wiring board 20 via the connector 105, the sensor chip 10 assembled to the housing 120 with high accuracy can be controlled. Therefore, with the control board 100, it is possible to perform image processing on a high-definition captured image acquired by the sensor chip 10 assembled to the housing 120 with high accuracy.

11. Imaging Apparatus of Tenth Embodiment

The imaging apparatus of a tenth embodiment according to the present technology is an imaging apparatus of the first embodiment further including a control board connected to the wiring board, connectors provided on each of the wiring board and the control board, and a flexible board for connecting the connector provided on the wiring board and the connector provided on the control board.

According to the imaging apparatus of the tenth embodiment according to the present technology, since the control board is directly connected to the wiring board via the flexible board, the sensor chip assembled to the housing with high accuracy can be controlled.

Figure 23:
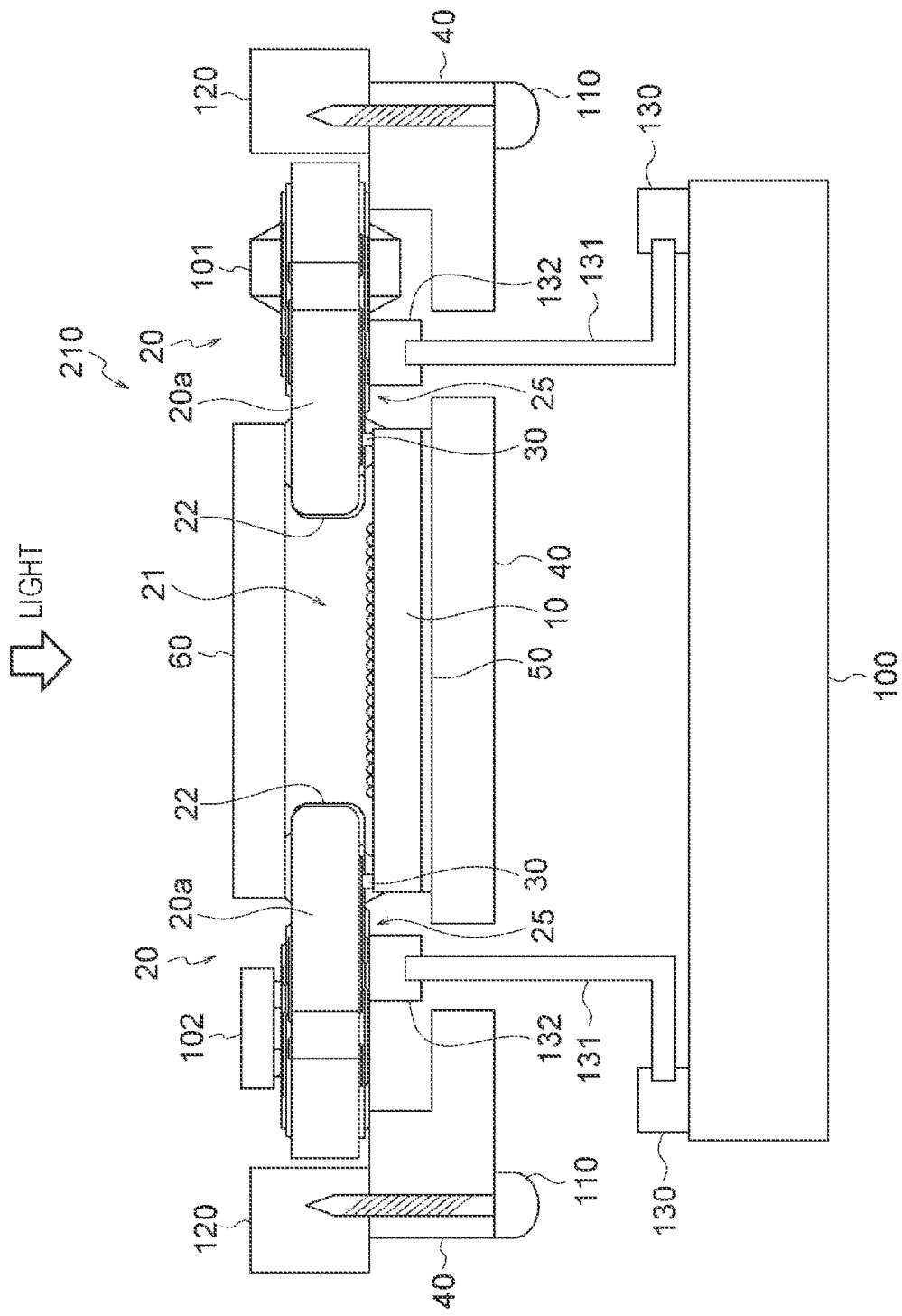
FIG. 23 is a cross-sectional view showing a configuration of an imaging apparatus of a tenth embodiment to which the present technology is applied.

FIG. 23 shows a configuration of an imaging apparatus 210 of the tenth embodiment to which the present technology is applied. FIG. 23 is a cross-sectional view showing a configuration of the imaging apparatus 210 according to the tenth embodiment to which the present technology is applied. Note that the same configuration as that of the imaging apparatus 200 of the first embodiment will be described using the same reference numerals, and the description thereof will be omitted as appropriate.

As shown in FIG. 23, the imaging apparatus 210 of the tenth embodiment includes the control board 100 connected to the wiring board 20, a first connector 130 provided on the control board 100, a second connector 132 provided on the laminated wiring layer 25 of the wiring board 20, and a flexible board 131 for connecting the first connector 130 and the second connector 132.

In the imaging apparatus 210 of the tenth embodiment, since the control board 100 is connected to the wiring board 20 as similar to the imaging apparatus 209 of the ninth embodiment, the control board 100 can control the sensor chip 10 via the first connector 130, the flexible board 131, the second connector 132, and the wiring board 20.

12. Imaging Apparatus of Eleventh Embodiment

An imaging apparatus of an eleventh embodiment according to the present technology is the imaging apparatus of the first embodiment further including a control board connected to the wiring board and a connector for connecting the wiring board and the control board.

According to the imaging apparatus of the eleventh embodiment according to the present technology, since the control board is directly connected to the wiring board via the connector, the sensor chip assembled to the housing with high accuracy can be controlled.

Figure 24:
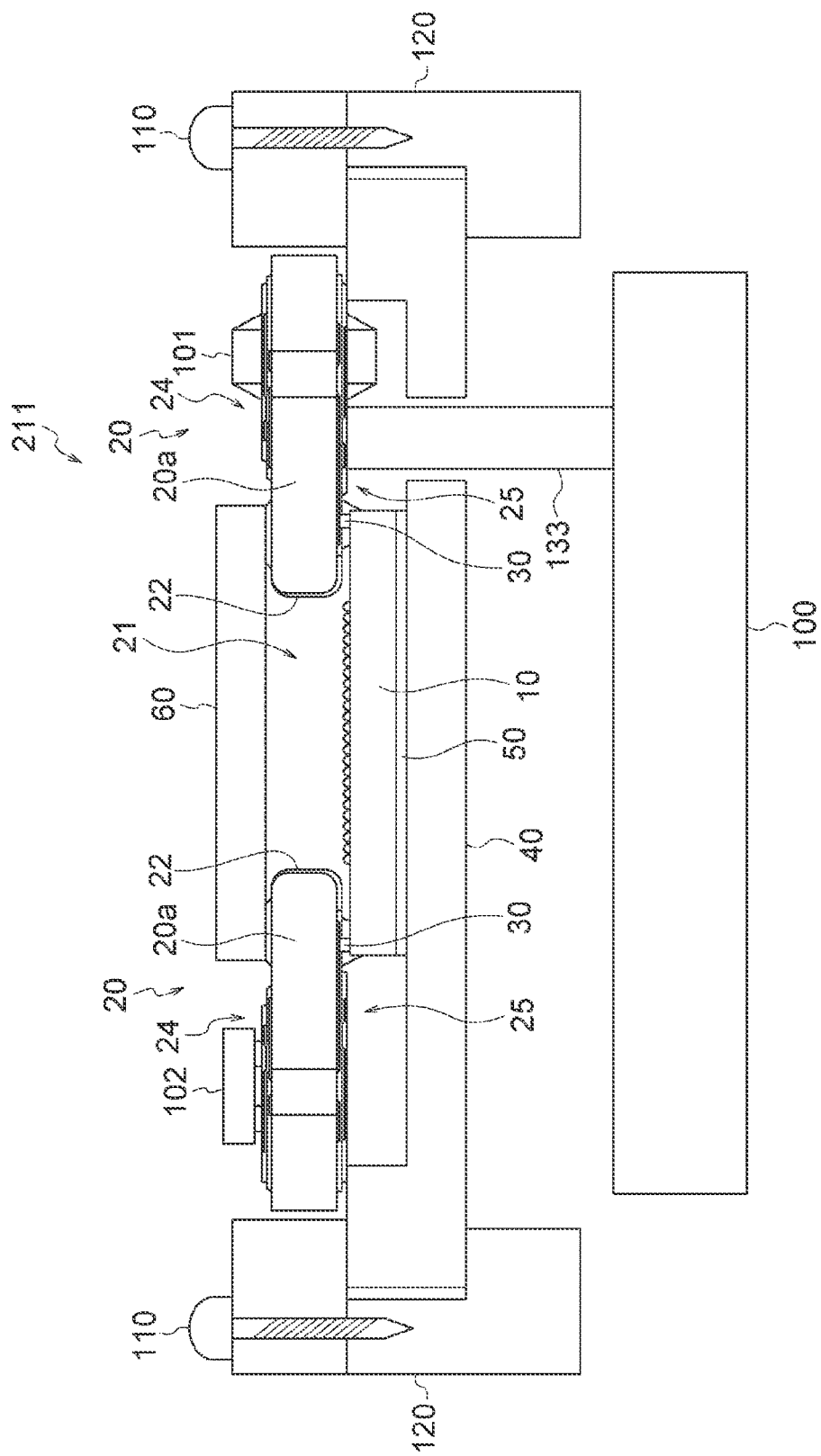
FIG. 24 is a cross-sectional view showing a configuration of an imaging apparatus of an eleventh embodiment to which the present technology is applied.

FIG. 24 shows a configuration of an imaging apparatus 211 of the eleventh embodiment to which the present technology is applied. FIG. 24 is a cross-sectional view showing a configuration of the imaging apparatus 211 according to the eleventh embodiment to which the present technology is applied. Note that the same configuration as that of the imaging apparatus 200 of the first embodiment and the imaging apparatus 209 of the ninth embodiment will be described using the same reference numerals, and the description thereof will be omitted as appropriate. Note that the difference from the imaging apparatus 209 of the ninth embodiment is the number of connectors 133 used. Therefore, the basic configuration is similar to that of the imaging apparatus 209 of the ninth embodiment.

As shown in FIG. 24, in the imaging apparatus 211 of the eleventh embodiment, the laminated wiring layer 25 and the control board 100 are connected via the connector 133. The control board 100 is connected to the sensor chip 10 via the connector 133 and the laminated wiring layer 25 of the wiring board 20.

Since the control board 100 can directly control the sensor chip 10, it is possible to perform image processing on a high-definition captured image acquired by the sensor chip 10 assembled to the housing 120 with high accuracy.

Figure 25B:
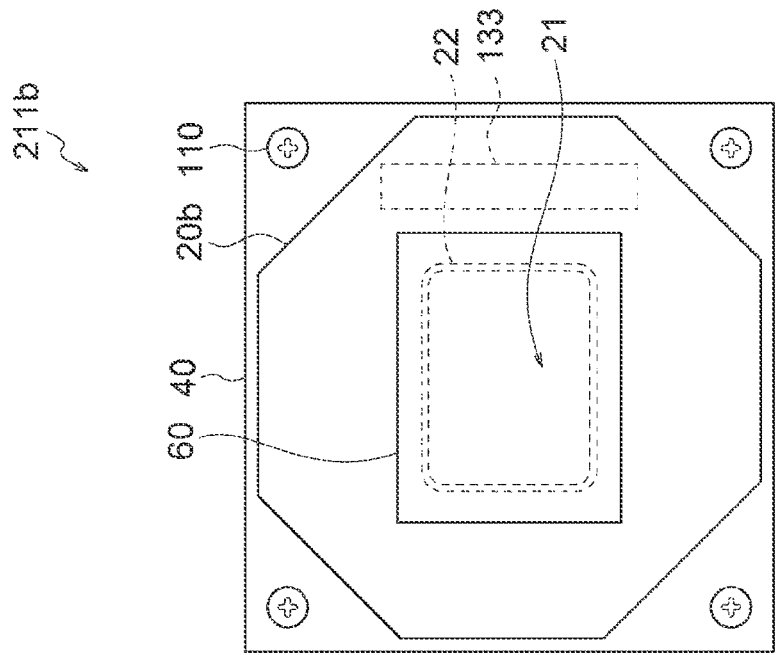
FIGS. 25A and 25B are examples top view showing a configuration of the imaging apparatus of the eleventh embodiment to which the present technology is applied.
Figure 25A:
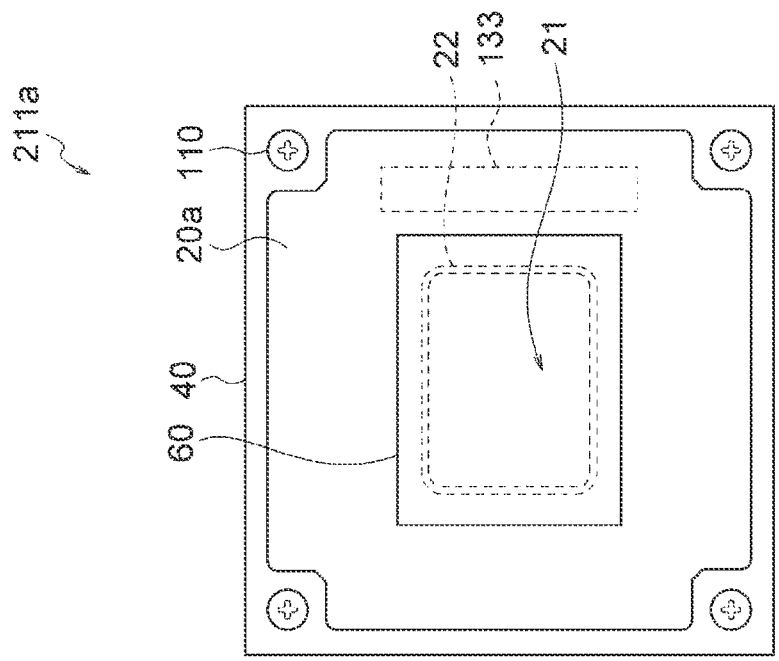

FIGS. 25A and 25B show an example top view of the configuration of the imaging apparatus according to the eleventh embodiment. FIGS. 25A and 25B are examples top view showing a configuration of the imaging apparatus according to the eleventh embodiment to which the present technology is applied. Note that the same configuration as that of the imaging apparatus 200 of the first embodiment will be described using the same reference numerals, and the description thereof will be omitted as appropriate. In FIGS. 25A and 25B, FIG. 25A shows a top view of the shape of the glass base material 20a, and FIG. 25B shows a top view of the shape of the glass base material 20b.

As shown in FIG. 25A, it is shown that, in the imaging apparatus 211a of the eleventh embodiment, the connector 133 is connected to the glass base material 20a. As shown in FIG. 25B, it is shown that, in the imaging apparatus 211b of the eleventh embodiment, the connector 133 is connected to the glass base material 20b.

As described above, in the imaging apparatus 211 of the eleventh embodiment, since the control board 100 is directly connected to the wiring board 20 via the connector 133, the sensor chip 10 assembled to the housing 120 with high accuracy can be controlled. Therefore, with the control board 100, it is possible to perform image processing on a high-definition captured image acquired by the sensor chip 10 assembled to the housing 120 with high accuracy.

13. Imaging Apparatus of Twelfth Embodiment

The imaging apparatus of a twelfth embodiment according to the present technology is an imaging apparatus of the first embodiment further including a control board connected to the wiring board, connectors provided on each of the wiring board and the control board, and a flexible board for connecting the connector provided on the wiring board and the connector provided on the control board.

According to the imaging apparatus of the twelfth embodiment according to the present technology, since the control board is directly connected to the wiring board via the flexible board, the sensor chip assembled to the housing with high accuracy can be controlled.

Figure 26:
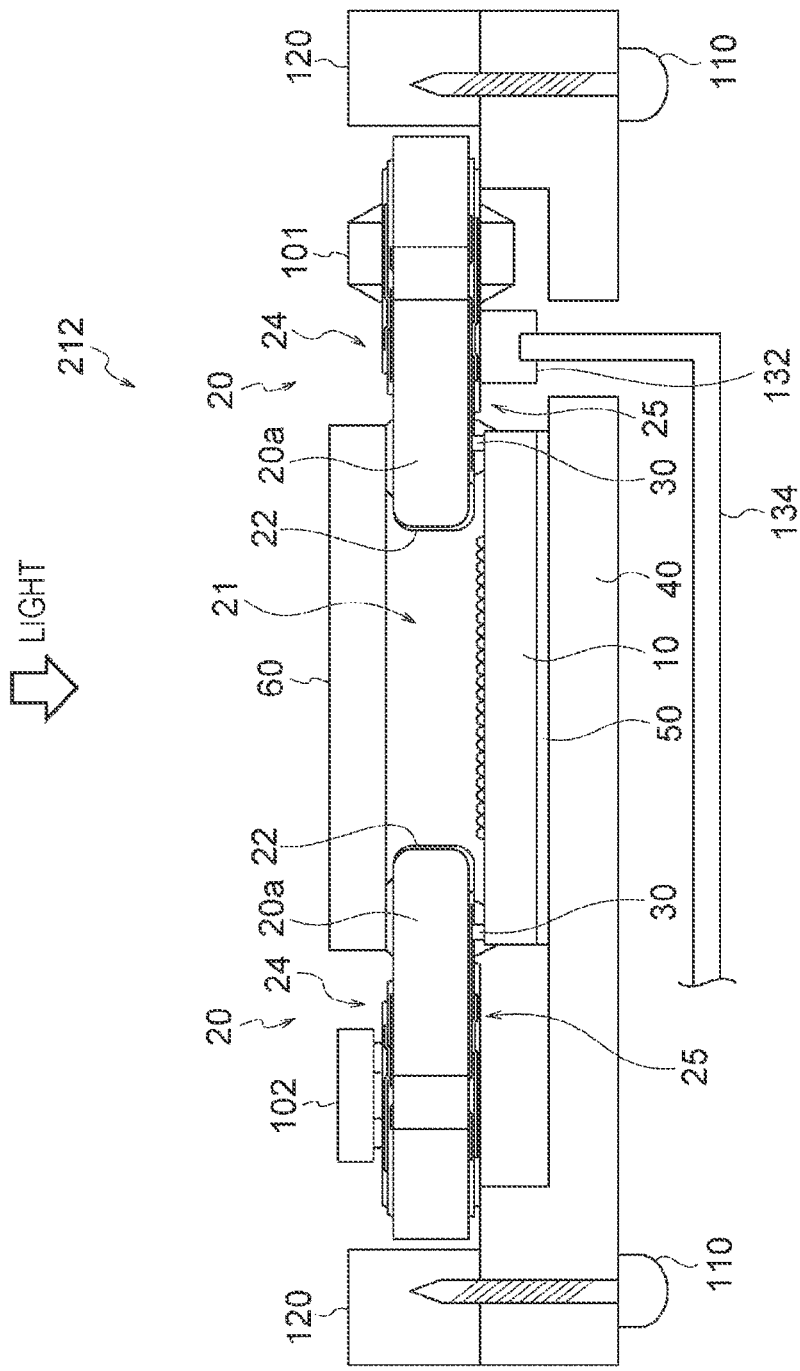
FIG. 26 is a cross-sectional view showing a configuration of an imaging apparatus of a twelfth embodiment to which the present technology is applied.

FIG. 26 shows a configuration of an imaging apparatus 212 of the twelfth embodiment to which the present technology is applied. FIG. 26 is a cross-sectional view showing a configuration of the imaging apparatus 212 according to the twelfth embodiment to which the present technology is applied. Note that the same configuration as that of the imaging apparatus 200 of the first embodiment and the imaging apparatus 210 of the tenth embodiment will be described using the same reference numerals, and the description thereof will be omitted as appropriate. Note that the difference from the imaging apparatus 210 of the tenth embodiment is the number of flexible boards 134 used. Therefore, the basic configuration is similar to that of the imaging apparatus 210 of the tenth embodiment.

As shown in FIG. 26, the imaging apparatus 212 of the twelfth embodiment includes the control board 100 (see FIG. 23) connected to the wiring board 20, a first connector 130 (see FIG. 23) provided on the control board 100, a second connector 132 provided on the laminated wiring layer 25 of the wiring board 20, and a flexible board 134 for connecting the first connector 130 and the second connector 132.

In the imaging apparatus 212 of the twelfth embodiment, since the control board 100 (see FIG. 23) is connected to the wiring board 20 as similar to the imaging apparatus 210 of the tenth embodiment, the control board 100 (see FIG. 23) can control the sensor chip 10 via the first connector 130 (see FIG. 23), the flexible board 134, the second connector 132, and the wiring board 20.

14. Thirteenth Embodiment of Electronic Device

An electronic device of a thirteenth embodiment according to the present technology is an electronic device including an imaging apparatus mounted, the imaging apparatus including at least a sensor chip and a wiring board having a glass base material, in which the imaging apparatus is joined to at least one of the sensor chip or the wiring board via a bump unit including a plurality of bumps, and each of the plurality of bumps is formed by conductive members having substantially the same composition. Furthermore, the electronic device of the thirteenth embodiment according to the present technology may be an electronic device equipped with the imaging apparatus of the first to twelfth embodiments according to the present technology.

Figure 27:
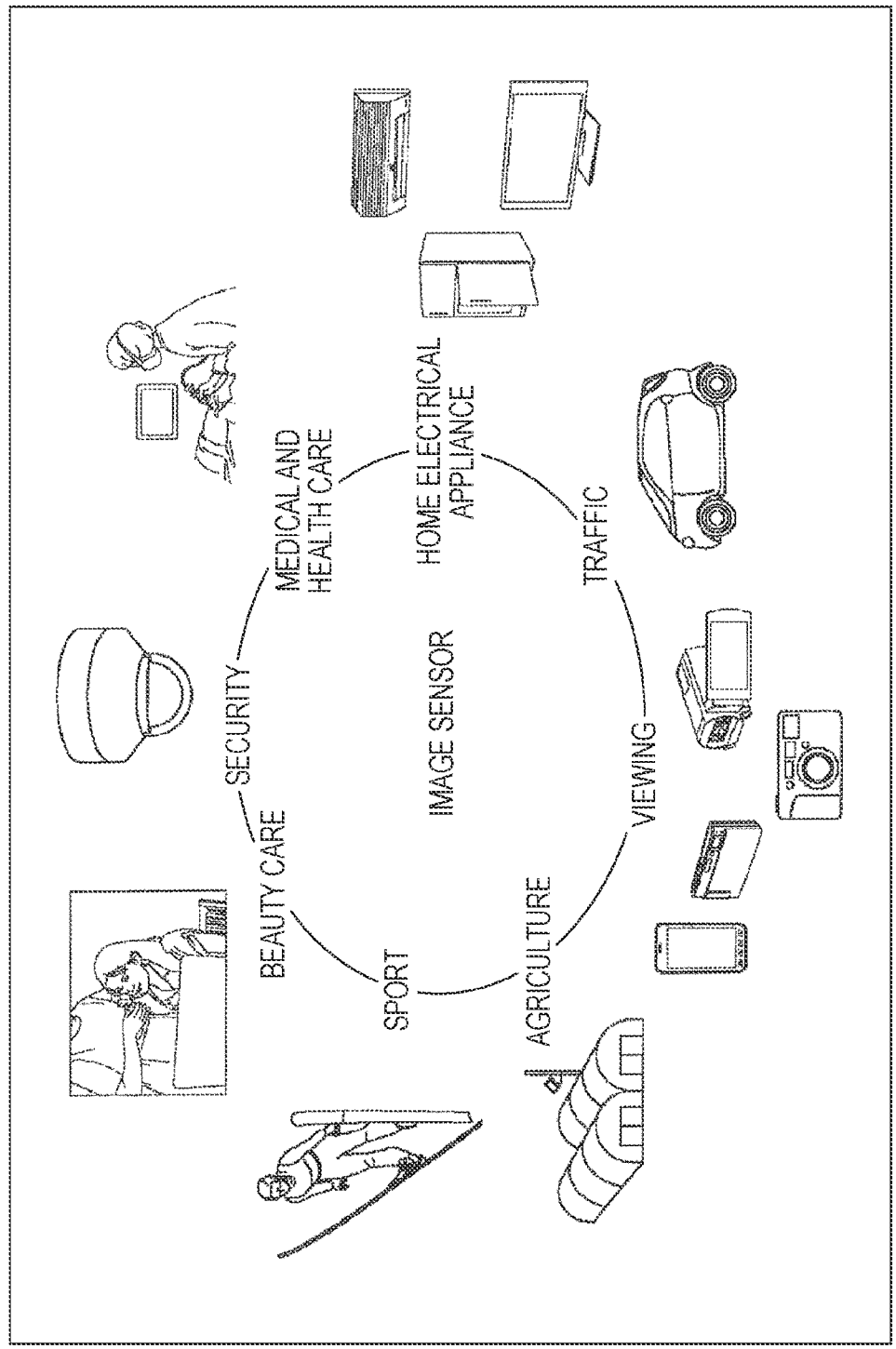
FIG. 27 is a diagram showing a use example of the imaging apparatus of the first to twelfth embodiments to which the present technology is applied.

15. Use Example of Imaging Apparatus to which the Present Technology is Applied FIG. 27 is a diagram showing a use example of the imaging apparatus of the first to twelfth embodiments according to the present technology as an image sensor.

The above-described imaging apparatus of the first to twelfth embodiments can be used in various cases, for example, for sensing light such as visible light, infrared light, ultraviolet light, or X-rays, as described below. That is, as shown in FIG. 27, for example, the imaging apparatus of the first to twelfth embodiments can be used in a device (for example, the above-described electronic device of the thirteenth embodiment) used in the field of viewing for capturing an image to be viewed, the field of traffic, the field of home electrical appliance, the field of medical and health care, the field of security, the field of beauty care, the field of sport, the field of agriculture, and the like.

Specifically, in the field of viewing, for example, the imaging apparatus of the first to twelfth embodiments can be used in a device for capturing an image to be viewed, such as a digital camera, smartphone, or mobile phone with a camera function.

In the field of traffic, for example, the imaging apparatus of the first to twelfth embodiments can be used in a device used for traffic purpose such as: an in-vehicle sensor for photographing the front, rear, surroundings, inside of a car, or the like of an automobile for safe driving such as automatic stop and recognition of driver's condition or the like; a surveillance camera for monitoring traveling vehicles and roads; and a distance measuring sensor that measures the distance between vehicles or the like In the field of home electrical appliance, for example, the imaging apparatus of the first to twelfth embodiments can be used in a device used as a home electrical appliance such as a television receiver, refrigerator, or air conditioner, for imaging a user's gesture so that the device is operated according to the gesture.

In the field of medical/health care, for example, the imaging apparatus of the first to twelfth embodiments can be used in a device used for medical and health care, such as an endoscope or device that performs angiography by receiving infrared light.

In the field of security, for example, the imaging apparatus of the first to twelfth embodiments can be used in a device used for security, such as a surveillance camera for crime prevention or a camera for personal authentication.

In the field of beauty care, for example, the imaging apparatus of the first to twelfth embodiments can be used in a device used for beauty care, such as a skin measuring device for imaging the skin, or microscope for imaging the scalp.

In the field of sport, for example, the imaging apparatus of the first to twelfth embodiments can be used in a device used for sport such as an action camera or wearable camera for sports applications and the like.

In the field of agriculture, for example, the imaging apparatus of the first to twelfth embodiments can be used in a device used for agriculture, such as a camera for monitoring the state of fields and crops.

The present technology can be applied to various products. An example of application to an endoscopic surgery system is described below.

16. Application Example to Endoscopic Surgery System

The technique according to the present disclosure can be applied to an endoscopic surgery system.

Figure 28:
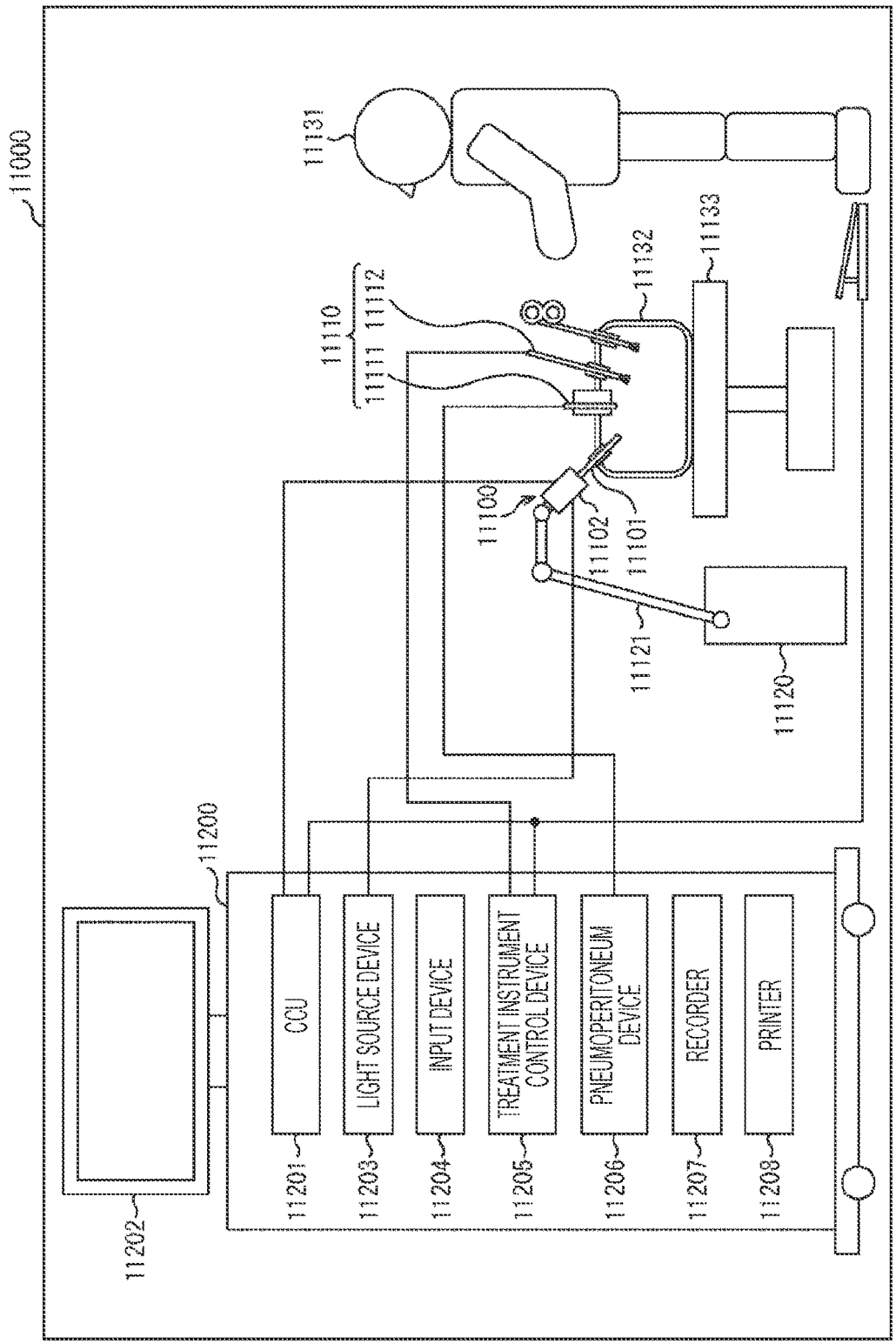
FIG. 28 is a diagram showing an example of a schematic configuration of an endoscopic surgery system.

FIG. 28 is a diagram showing an example of a schematic configuration of an endoscopic surgery system to which the present technology can be applied.

FIG. 28 shows a situation where a surgeon (physician) 11131 performs surgery on a patient 11132 on a patient bed 11133 using an endoscopic surgery system 11000. As shown in the drawing, the endoscopic surgery system 11000 includes an endoscope 11100, other surgical tools 11110 such as a pneumoperitoneum tube 11111 and an energy treatment instrument 11112, a support arm device 11120 that supports the endoscope 11100, and a cart 11200 on which various devices for endoscopic surgery are mounted.

The endoscope 11100 includes a lens barrel 11101 in which a region of a predetermined length from the distal end is inserted into the body cavity of the patient 11132, and a camera head 11102 connected to the proximal end of the lens barrel 11101. In the illustrated example, the endoscope 11100 formed as a so-called rigid mirror having a rigid lens barrel 11101 is illustrated. However, the endoscope 11100 may be formed as a so-called flexible mirror having a flexible lens barrel.

At the tip of the lens barrel 11101, an opening portion into which an objective lens is fitted is provided. The light source device 11203 is connected to the endoscope 11100 and light generated by the light source device 11203 is guided to the distal end of the lens barrel by a light guide extending inside the lens barrel 11101, and is emitted toward the observation target in the body cavity of the patient 11132 via the objective lens. Note that the endoscope 11100 may be a direct view mirror, a perspective mirror or a side view mirror.

An optical system and an imaging element are provided inside the camera head 11102, and reflected light (observation light) from the observation target is collected to the imaging element by the optical system. The observation light is photoelectrically converted by the imaging element, and an electric signal corresponding to the observation light, that is, an image signal corresponding to the observation image is generated. The image signal is transmitted as RAW data to a camera control unit (CCU) 11201.

The CCU 11201 includes a central processing unit (CPU) or graphics processing unit (GPU), or the like, and centrally controls operation of the endoscope 11100 and the display device 11202. Moreover, the CCU 11201 receives an image signal from the camera head 11102, and performs various image processing for display of the image based on the image signal, such as, development processing (demosaic processing), for example, for the image signal.

The display device 11202 displays the image based on the image signal subjected to image processing by the CCU 11201 under the control of the CCU 11201.

The light source device 11203 includes a light source such as a light emitting diode (LED), for example, and supplies irradiation light to the endoscope 11100 in photographing a surgical site or the like.

The input device 11204 is an input interface to the endoscopic surgery system 11000. The user can input various kinds of information and input instructions to the endoscopic surgery system 11000 via the input device 11204. For example, the user inputs an instruction or the like to change imaging conditions by the endoscope 11100 (kind of irradiation light, magnification, focal length, or the like).

The treatment instrument control device 11205 controls driving of the energy treatment instrument 11112 for cauterizing tissue, cutting incisions, sealing blood vessels, or the like. The pneumoperitoneum device 11206 feeds gas into the body cavity of the patient 11132 via the pneumoperitoneum tube 11111 to inflate the body cavity for the purpose of securing a visual field by the endoscope 11100 and securing a working space of the surgeon. The recorder 11207 is a device capable of recording various kinds of information associated with surgery. The printer 11208 is a device capable of printing various kinds of information associated with surgery in various formats such as text, image, and graph.

Note that the light source device 11203 that supplies irradiation light in photographing of a surgical site to the endoscope 11100 can include, for example, a white light source including an LED, a laser light source, or a combination thereof. In a case where the white light source is configured by the combination of the RGB laser light sources, since the output intensity and the output timing of each color (each wavelength) can be controlled with high accuracy, adjustment of the white balance of the captured image by the light source device 11203 can be performed. Furthermore, in this case, the laser light from each of the RGB laser light sources is emitted to the observation target in time division and driving of the imaging element of the camera head 11102 is controlled in synchronization with the emission timing, so that it is possible to image images corresponding to each of RGB in time division. According to this method, a color image can be obtained without providing a color filter in the imaging element.

Furthermore, the light source device 11203 may be controlled to change the intensity of light to be output at predetermined time intervals. The driving of the imaging element of the camera head 11102 is controlled in synchronization with the timing of the change of the intensity of the light, images are obtained in time division, and the images are combined, so that it is possible to generate a high dynamic image in which so-called halation and black defects do not exist.

Furthermore, the light source device 11203 may be configured to be capable of supplying light of a predetermined wavelength band corresponding to special light observation. In the special light observation, for example, the wavelength dependence of light absorption in the body tissue is utilized, and narrow band light compared with irradiation light at the time of ordinary observation (in other words, white light) is emitted, so that photographing a predetermined tissue such as a blood vessel in the mucosal surface layer with high contrast, so-called narrow band imaging, is performed. Alternatively, in the special light observation, fluorescence observation for obtaining an image by fluorescence generated by emitting excitation light may be performed. In the fluorescence observation, it is possible to irradiate a body tissue with excitation light to observe the fluorescence from the body tissue (autofluorescence observation), or to inject a reagent such as indocyanine green (ICG) to the body tissue and irradiate the body tissue with excitation light corresponding to the fluorescence wavelength of the reagent to obtain a fluorescent image, for example. The light source device 11203 can be configured to be able to supply narrowband light and/or excitation light corresponding to such special light observation.

Figure 29:
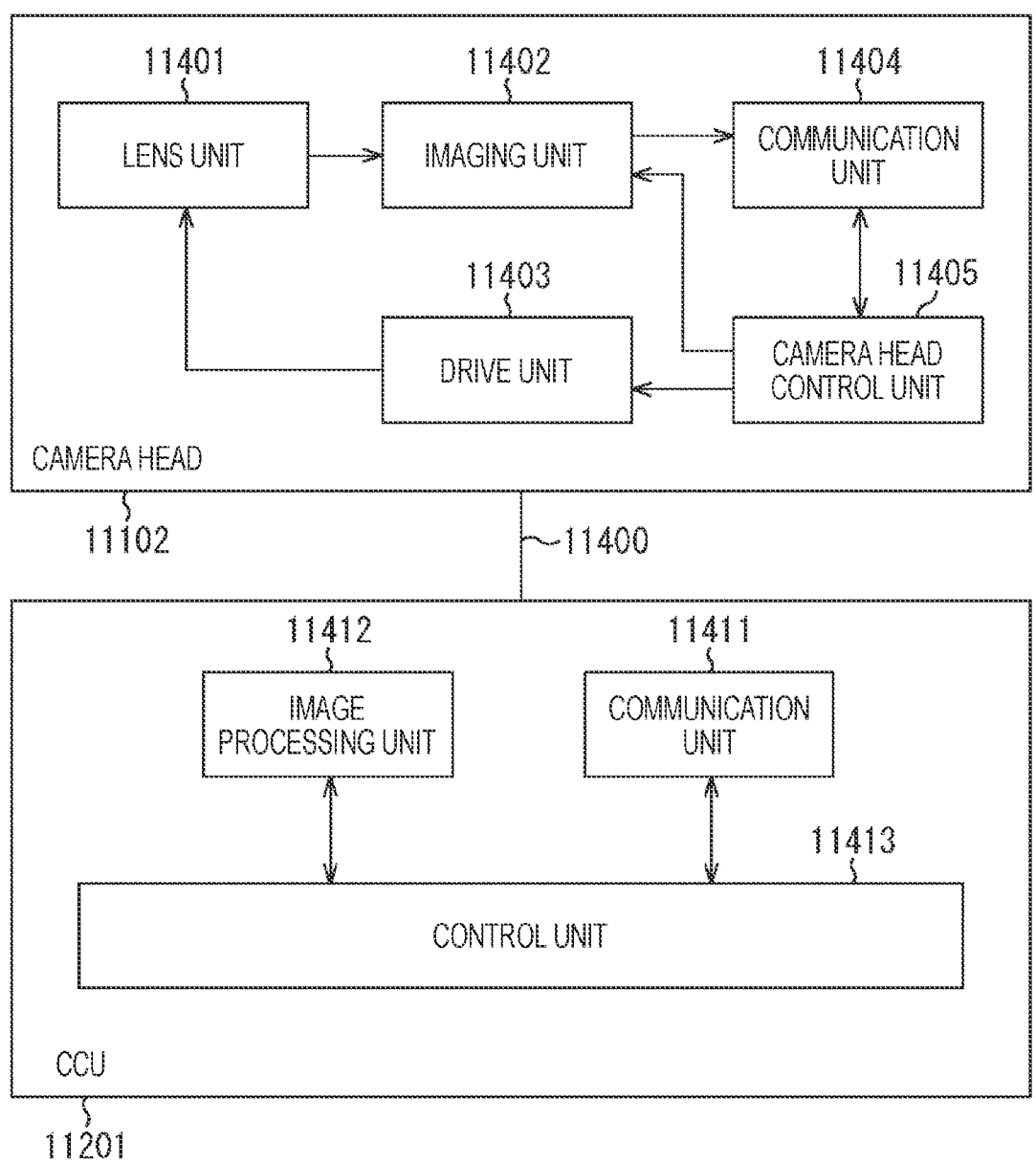
FIG. 29 is a block diagram showing an example of a functional configuration of a camera head and a CCU.

FIG. 29 is a block diagram showing an example of a functional configuration of the camera head 11102 and the CCU 11201 shown in FIG. 28.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connecting portion with the lens barrel 11101. The observation light taken in from the distal end of the lens barrel 11101 is guided to the camera head 11102 and is incident on the lens unit 11401. The lens unit 11401 is configured by combining a plurality of lenses including a zoom lens and a focus lens.

The imaging unit 11402 includes an imaging element. The imaging element included in the imaging unit 11402 may be one (so-called single plate type) or plural (so-called multiple plate type). In the case where the imaging unit 11402 is formed in a multiple plate type, for example, image signals corresponding to each of R, G, and B may be generated by each imaging element, and the signals may be combined so that a color image is obtained. Alternatively, the imaging unit 11402 may have a pair of imaging elements for acquiring right-eye and left-eye image signals corresponding to 3 dimensional (3D) display, respectively. By the 3D display, the surgeon 11131 can grasp the depth of a living tissue in the surgical site more accurately. Note that, in a case where the imaging unit 11402 is formed in a multiple plate type, a plurality of lens units 11401 can be provided corresponding to each imaging element.

Furthermore, the imaging unit 11402 is not necessarily provided in the camera head 11102. For example, the imaging unit 11402 may be provided inside the lens barrel 11101 immediately after the objective lens.

The drive unit 11403 includes an actuator and moves the zoom lens and the focus lens of the lens unit 11401 by a predetermined distance along the optical axis under the control of the camera head control unit 11405. As a result, the magnification and the focus of the captured image by the imaging unit 11402 can be appropriately adjusted.

The communication unit 11404 includes a communication device for transmitting and receiving various kinds of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal may include, for example, information associated with imaging conditions such as information that a frame rate of the captured image is designated, information that an exposure value at the time of imaging is designated, and/or information that the magnification and focus of the captured image are designated.

Note that the imaging conditions such as the frame rate, the exposure value, the magnification, and the focus may be appropriately specified by a user, or may be automatically set by the control unit 11413 of the CCU 11201 on the basis of the acquired image signal. In the latter case, the so-called auto exposure (AE) function, the auto focus (AF) function, and the auto white balance (AWB) function are installed in the endoscope 11100.

The camera head control unit 11405 controls driving of the camera head 11102 on the basis of the control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

Furthermore, the communication unit 11411 transmits a control signal for controlling driving of the camera head 11102 to the camera head 11102. The image signal and the control signal can be transmitted by electric communication, optical communication, or the like.

The image processing unit 11412 performs various image processing on the image signal which is RAW data transmitted from the camera head 11102.

The control unit 11413 performs various control relating to imaging of a surgical site or the like by the endoscope 11100, and display of captured images obtained by imaging of a surgical site or the like. For example, the control unit 11413 generates a control signal for controlling driving of the camera head 11102.

Furthermore, the control unit 11413 causes the display device 11202 to display the captured image including a surgical site or the like on the basis of the image signal subjected to the image processing by the image processing unit 11412. In this case, the control unit 11413 may recognize various objects in the captured image using various image recognition techniques. For example, the control unit 11413 can recognize a surgical tool such as a forceps, a specific body part, bleeding, a mist at the time of using the energy treatment instrument 11112, or the like by detecting the shape, color, or the like of the edge of the object included in the captured image. When causing the display device 11202 to display the captured image, the control unit 11413 may cause various surgical operation support information to be superimposed and displayed on the image of the surgical site using the recognition result. The surgical operation support information is superimposed and displayed, and presented to the surgeon 11131, so that the burden on the surgeon 11131 can be reduced and the surgeon 11131 can reliably proceed with surgery.

The transmission cable 11400 connecting the camera head 11102 and the CCU 11201 is an electric signal cable corresponding to communication of electric signals, an optical fiber corresponding to optical communication, or a composite cable thereof.

Here, in the example shown in the drawing, communication is performed by wire using the transmission cable 11400. However, communication between the camera head 11102 and the CCU 11201 may be performed wirelessly.

An example of the endoscopic surgery system to which the technology according to the present disclosure can be applied has been described above. The technology according to the present disclosure can be applied to the imaging unit 11402 of the camera head 11102 in the above-described configuration. Specifically, the imaging apparatuses 200 to 212 according to the present technology can be applied to the imaging unit 11402. By applying the present technology to the imaging unit 11402, a clearer operative image can be obtained, so that the surgeon can reliably confirm the operative site.

Note that, although an endoscopic surgery system has been described as an example here, the present technology may also be applied to, for example, a capsule endoscopic system or the like.

17. Application Example to Mobile Body

The technology according to the present disclosure can be applied to various products. For example, the present technology may be realized as a device mounted on any type of mobile body such as a car, electric vehicle, hybrid electric vehicle, motorcycle, bicycle, personal mobility, airplane, drone, ship, or robot.

Figure 30:
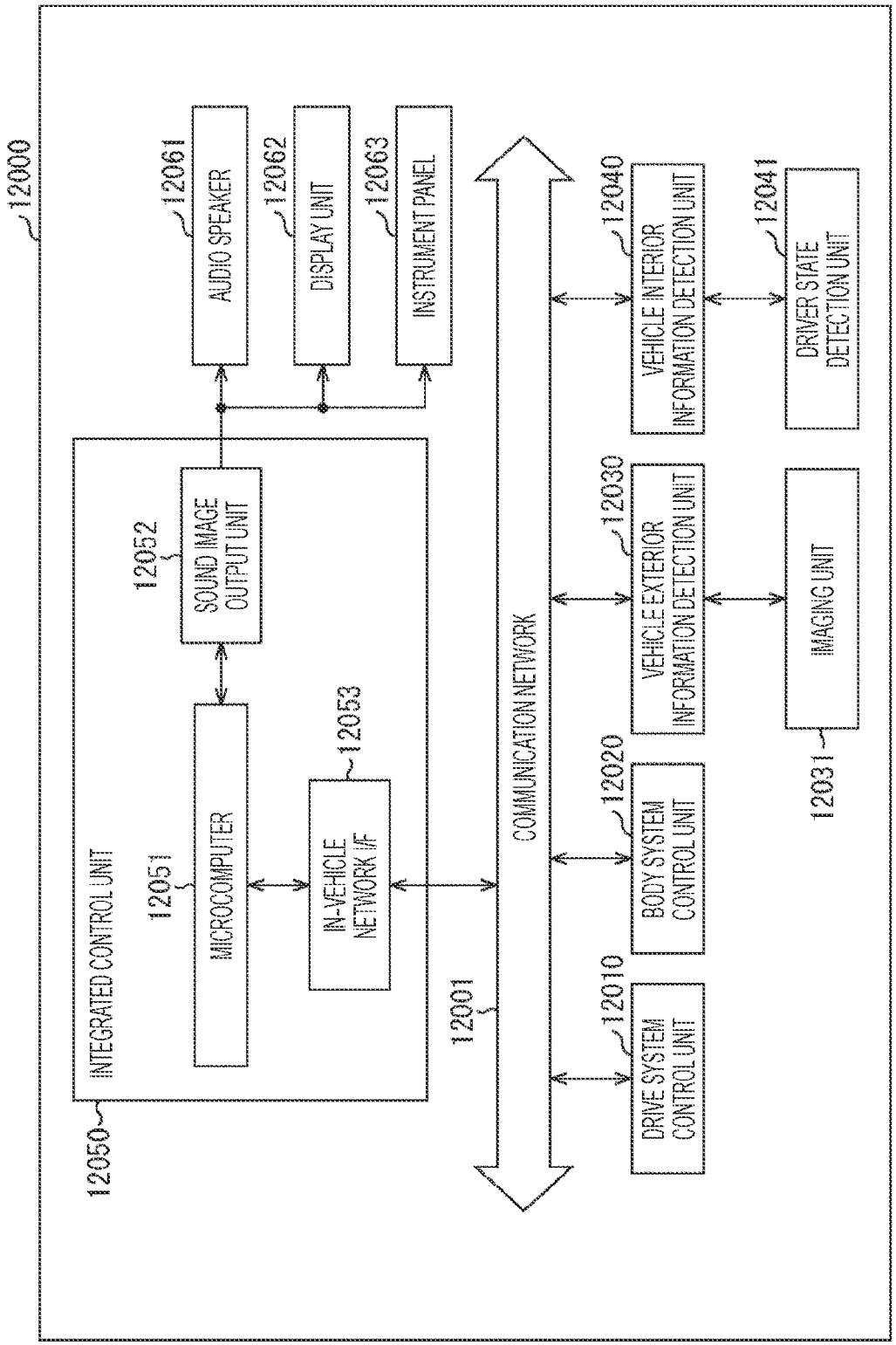
FIG. 30 is a block diagram showing an example of a schematic configuration of a vehicle control system.

FIG. 30 is a block diagram showing a schematic configuration example of a vehicle control system which is an example of a mobile body control system to which the technology according to the present disclosure can be applied.

The vehicle control system 12000 includes a plurality of electronic control units connected via a communication network 12001. In the example shown in FIG. 30, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, a sound image output unit 12052, and an in-vehicle network interface (I/F) 12053 are illustrated.

The drive system control unit 12010 controls the operation of devices related to the drive system of the vehicle according to various programs. For example, the drive system control unit 12010 functions as a control device for a driving force generating device for generating a driving force of a vehicle such as an internal combustion engine or a driving motor, a driving force transmitting mechanism for transmitting a driving force to the wheels, a steering mechanism that adjusts steering of a vehicle, a braking device that generates a braking force of a vehicle, or the like.

The body system control unit 12020 controls the operation of various devices equipped in a vehicle body according to various programs. For example, the body system control unit 12020 functions as a control device for a keyless entry system, a smart key system, a power window device, or various lamps such as a head lamp, a back lamp, a brake lamp, a turn indicator, or a fog lamp. In this case, a radio wave transmitted from a portable device that substitutes for a key or a signal of various switches may be input to the body system control unit 12020. The body system control unit 12020 receives the input of these radio waves or signals and controls a door lock device, a power window device, a lamp, or the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform object detection processing or distance detection processing such as a person, a car, an obstacle, a sign, or a character on a road surface, on the basis of the received image.

The imaging unit 12031 is an optical sensor that receives light and outputs an electric signal corresponding to the amount of light received. The imaging unit 12031 can output an electric signal as an image or output the electric signal as distance measurement information. Furthermore, the light received by the imaging unit 12031 may be visible light or invisible light such as infrared light.

The vehicle interior information detection unit 12040 detects information inside the vehicle. For example, a driver state detection unit 12041 that detects the state of the driver is connected to the vehicle interior information detection unit 12040. The driver state detection unit 12041 includes, for example, a camera that images the driver, and the vehicle interior information detection unit 12040 may calculate the degree of fatigue or degree of concentration of the driver on the basis of the detection information input from the driver state detection unit 12041, or may determine whether or not the driver is dozing off.

The microcomputer 12051 can calculate a control target value of the driving force generating device, the steering mechanism, or the braking device on the basis of the information inside and outside of the vehicle acquired by the vehicle exterior information detection unit 12030 or the vehicle interior information detection unit 12040, and can output a control command to the drive system control unit 12010. For example, the microcomputer 12051 can perform cooperative control for the purpose of realization of the function of advanced driver assistance system (ADAS) including collision avoidance or impact mitigation of the vehicle, follow-up running based on the distance between vehicles, vehicle speed maintenance running, vehicle collision warning, vehicle lane departure warning, or the like.

Furthermore, the microcomputer 12051 controls the driving force generating device, the steering mechanism, the braking device, or the like on the basis of the information regarding the surroundings of the vehicle acquired by the vehicle exterior information detection unit 12030 or the vehicle interior information detection unit 12040, so that the microcomputer 12051 can perform cooperative control for the purpose of, for example, automatic driving in which a vehicle autonomously runs without depending on the operation of the driver.

Furthermore, the microcomputer 12051 can output a control command to the body system control unit 12030 on the basis of the vehicle exterior information acquired by the vehicle exterior information detection unit 12030. For example, the microcomputer 12051 can control the headlamp according to the position of the preceding vehicle or the oncoming vehicle detected by the vehicle exterior information detection unit 12030, and perform cooperative control for the purpose of antiglare such as switching the high beam to low beam.

The sound image output unit 12052 transmits at least one of sound or image output signals to an output device capable of visually or audibly notifying the occupant of the vehicle or the outside of the vehicle, of information. In the example of FIG. 30, as an output device, an audio speaker 12061, a display unit 12062, and an instrument panel 12063 are illustrated. The display unit 12062 may include at least one of an on-board display or a head-up display, for example.

Figure 31:
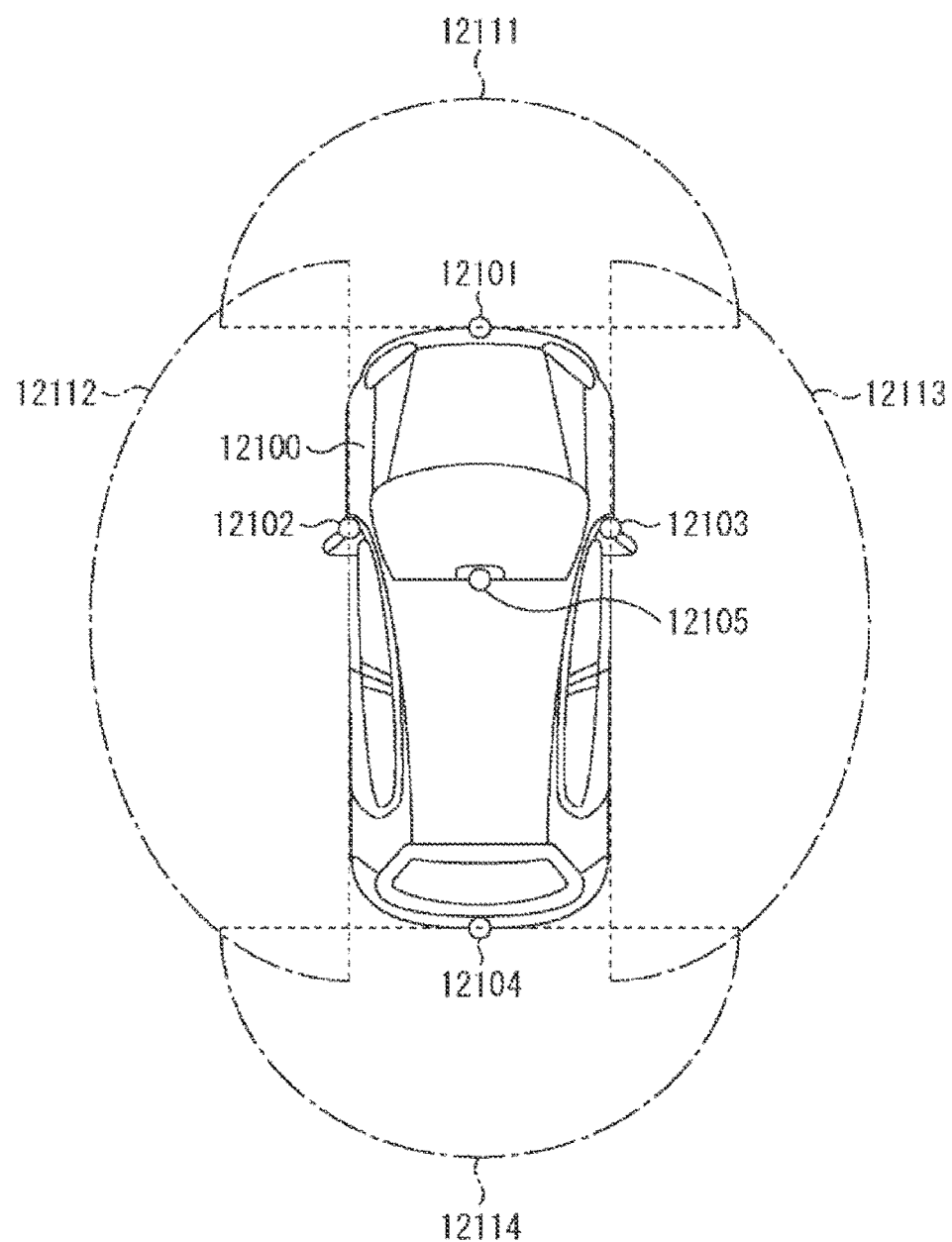
FIG. 31 is an explanatory diagram showing an example of installation positions of a vehicle exterior information detection part and an imaging unit.

FIG. 31 is a diagram showing an example of an installation position of an imaging unit 12031.

In FIG. 31, as the imaging unit 12031, imaging units 12101, 12102, 12103, 12104, and 12105 are included.

For example, the imaging units 12101, 12102, 12103, 12104, and 12105 are provided at positions such as the front nose, the side mirror, the rear bumper, the back door, and the upper portion of the windshield in the vehicle compartment of the vehicle 12100. The imaging unit 12101 included in the front nose and the imaging unit 12105 included in the upper portion of the windshield in the vehicle compartment mainly acquire an image of the forward of the vehicle 12100. The imaging units 12102 and 12103 included in the side mirrors mainly acquire images of the sides of the vehicle 12100. The imaging unit 12104 included in the rear bumper or the back door mainly acquires images of the rearward of the vehicle 12100. The imaging unit 12105 included in the upper portion of the windshield in the vehicle compartment is mainly used for detection of a preceding vehicle, a pedestrian, an obstacle, a traffic signal, a traffic sign, a lane, or the like.

Note that FIG. 31 shows an example of the imaging range of the imaging units 12101 to 12104. An imaging range 12111 indicates an imaging range of the imaging unit 12101 provided in the front nose, the imaging ranges 12112 and 12113 indicate the imaging range of the imaging units 12102 and 12103 provided in the side mirror, respectively, and the imaging range 12114 indicates the imaging range of the imaging unit 12104 provided in the rear bumper or the back door. For example, by overlapping the image data imaged by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having a pixel for phase difference detection.

For example, the microcomputer 12051 obtains the distance to each three-dimensional object within the imaging range 12111 to 12114 and the temporal change of the distance (relative speed with respect to the vehicle 12100), on the basis of the distance information obtained from the imaging units 12101 to 12104, so that the microcomputer 12051 can extract a three-dimensional object that is the closest on the traveling path of the vehicle 12100 and runs at a predetermined speed (for example, 0 km/h or more) in substantially the same direction as that of the vehicle 12100, as a preceding vehicle. Moreover, the microcomputer 12051 can set an inter-vehicle distance to be secured in front of the preceding vehicle, and can perform automatic brake control (including follow-up stop control), automatic acceleration control (including follow-up start control), or the like. In this manner, it is possible to perform cooperative control for the purpose of automatic driving or the like that autonomously runs without depending on the operation of the driver.

For example, on the basis of the distance information obtained from the imaging units 12101 to 12104, the microcomputer 12051 can classify three-dimensional object data on the three-dimensional object into three-dimensional objects such as a two-wheeled vehicle, a regular vehicle, a large vehicle, a pedestrian, a telephone pole, and other three-dimensional objects such as a telephone pole, and extract the result to use the result for automatic avoidance of obstacles. For example, the microcomputer 12051 identifies an obstacle in the vicinity of the vehicle 12100 as an obstacle that the driver of the vehicle 12100 can see and an obstacle that is difficult to see. Then, the microcomputer 12051 determines the collision risk indicating the risk of collision with each obstacle, and when the collision risk is equal to or higher than a set value and there is a possibility of collision, the microcomputer 12051 can output an alarm to the driver via the audio speaker 12061 and the display unit 12062 or perform forced deceleration or avoiding steering via the drive system control unit 12010, so as to perform driving assistance for collision avoidance.

At least one of the imaging units 12101 to 12104 may be an infrared camera for detecting infrared rays. For example, the microcomputer 12051 can recognize a pedestrian by determining whether or not a pedestrian exists in the captured images of the imaging units 12101 to 12104. Such recognizing of a pedestrian is performed, for example, by a procedure of extracting feature points in the captured image of the imaging units 12101 to 12104 as an infrared camera and a procedure of performing pattern matching processing on a series of feature points indicating the outline of the object and discriminate whether or not it is a pedestrian. If the microcomputer 12051 determines that a pedestrian exists in the captured images of the imaging units 12101 to 12104 and recognizes the pedestrian, the sound image output unit 12052 causes the display unit 12062 to superimpose and display a rectangular contour line for emphasis on the recognized pedestrian. Furthermore, the sound image output unit 12052 may cause the display unit 12062 to display icons or the like indicating pedestrians at desired positions.

An example of the vehicle control system to which the present technology can be applied has been described above. The present technology can be applied to the imaging apparatuses 200 to 212 and the like in the above-described configuration. By applying the present technology to the imaging apparatus, a clearer captured image can be obtained, so that it is possible to reduce driver fatigue.

Furthermore, note that the first to twelfth embodiments according to the present technology are not limited to the above-described embodiments, and various modifications are possible without departing from the gist of the present technology.

Furthermore, the effects described in the present specification are merely examples and are not intended to be limiting, and other effects may be provided.

Furthermore, the present technology can adopt the following configuration.

(1) An imaging apparatus including
a sensor chip and
a wiring board having a glass base material,
in which the imaging apparatus is joined to at least one of the sensor chip or the wiring board via a bump unit including a plurality of bumps, and
each of the plurality of bumps is formed by conductive members having substantially the same composition.

(2) The imaging apparatus according to (1) described above,
in which the bump unit includes a first bump and a second bump,
the first bump is formed on the sensor chip, the second bump is formed on the wiring board, and the sensor chip and the wiring board are joined to each other, and
a thickness of the first bump and a thickness of the second bump are 2 μm or more and 50 μm or less, respectively.

(3) The imaging apparatus according to (1) or (2) described above, in which at least one of the plurality of bumps is formed on an upper surface of the wiring board, and a laminated wiring layer including an insulating layer and a metal wiring layer is not formed in a region of a lower surface of the wiring board facing the at least one of the plurality of bumps.

(4) The imaging apparatus according to (1) or (2) described above, in which at least one of the plurality of bumps is formed on an upper surface of the wiring board, and a laminated wiring layer including an insulating layer and a metal wiring layer is formed in a region of a lower surface of the wiring board facing the at least one of the plurality of bumps.

(5) The imaging apparatus according to (4) described above, in which the laminated wiring layer is formed in at least two or more of the region, and layer configurations of wiring layers forming the laminated wiring layer formed in the two or more regions are substantially the same.

(6) The imaging apparatus according to any one of claims (1) to (5) further including a protective member that protects the sensor chip,
in which the sensor chip is fixed between the protective member and the wiring board, and
an adhesive is arranged on the glass base material and a wiring layer of the wiring board, and the glass base material and the wiring layer of the wiring board are adhered to the protective member.

(7) The imaging apparatus according to (6) described above, in which a cushioning material is arranged between the sensor chip and the protective member.

(8) The imaging apparatus according to (6) described above,
in which the protective member is fixed to a housing that accommodates the sensor chip.

(9) An imaging apparatus including
a sensor chip,
a wiring board having a glass base material, and
a protective member that protects the sensor chip,
in which an adhesive is arranged on the glass base material and a wiring layer of the wiring board, and the glass base material and the wiring layer of the wiring board are adhered to the protective member.

(10) An electronic device including an imaging apparatus mounted, the imaging apparatus including at least
a sensor chip and
a wiring board having a glass base material,
in which the imaging apparatus is joined to at least one of the sensor chip or the wiring board via a bump unit including a plurality of bumps, and
each of the plurality of bumps is formed by conductive members having substantially the same composition.

REFERENCE SIGNS LIST

10 Sensor chip
20 Wiring board
21 Opening
22 Antireflection film
23 Through electrode
24 Laminated wiring layer
25 Laminated wiring layer
26 Insulating layer
27 Metal wiring
28 Pad
29 Insulating layer
30 Bump unit
31 First bump
32 Second bump
33 Underfiller
40, 41 Protective member
50 Cushioning material
60 Cover glass
70 Laminated wiring layer
71, 72 Insulating layer
73 Metal wiring layer 74, 76, 78, 79 Adhesive
77 Strengthening agent
100 Control board
101, 102 Component
105 Connector
110 Screw
120 Housing
125 Slit
130 First connector
131, 134 Flexible board
132 Second connector
133 Connector
200, 201, 202, 203, 204, 205 Imaging apparatus
JI1, JI2 Bonding interface
BI Bump interface
T1, T2 Thickness

The invention claimed is:

1. An imaging apparatus comprising:
a sensor chip;
a wiring board having a glass base material and a laminated wiring layer; and
a protective member that protects the sensor chip, wherein:
the sensor chip and the wiring board are joined via a bump unit including a plurality of bumps,
the bump unit includes a first bump and a second bump,
the first bump is formed on the sensor chip and the second bump is formed on the first bump before the sensor chip and the wiring board are joined,
each of the plurality of bumps is formed by conductive members having substantially same composition, wherein
an adhesive is arranged on the glass base material and the laminated wiring layer of the wiring board, and the glass base material and the laminated wiring layer of the wiring board are adhered to the protective member, and wherein
the adhesive includes a first adhesive and a second adhesive such that the first adhesive is arranged on a side surface of the glass base material and is arranged up to the protective member, and
the second adhesive is arranged between the glass base material and the protective member.

2. The imaging apparatus according to claim 1, wherein at least one of the plurality of bumps is formed on an upper surface of the wiring board, and the laminated wiring layer including an insulating layer and a metal wiring layer is not formed in a region of a lower surface of the wiring board facing the at least one of the plurality of bumps.

3. The imaging apparatus according to claim 1, wherein at least one of the plurality of bumps is formed on an upper surface of the wiring board, and the laminated wiring layer including an insulating layer and a metal wiring layer is formed in a region of a lower surface of the wiring board facing the at least one of the plurality of bumps.

4. The imaging apparatus according to claim 3, wherein the laminated wiring layer is formed in at least two or more of the region, and layer configurations of wiring layers forming the laminated wiring layer formed in the two or more regions are substantially same.

5. The imaging apparatus according to claim 1, wherein the sensor chip is fixed between the protective member and the wiring board.

6. The imaging apparatus according to claim 1, wherein a cushioning material is arranged between the sensor chip and the protective member.

7. The imaging apparatus according to claim 1, wherein the protective member is fixed to a housing that accommodates the sensor chip.

8. The imaging apparatus according to claim 1, further comprising
a cover glass, wherein the wiring board is joined to the cover glass and the sensor chip.

9. The imaging apparatus according to claim 1, wherein the sensor chip is mounted on the wiring board so as to follow a degree of flatness of the glass base material.

10. The imaging apparatus according to claim 1, wherein the first bump and the second bump are deformed on an application of a load to the wiring board at a time of bonding the sensor chip and the wiring board.

11. An imaging apparatus comprising:
a sensor chip;
a wiring board having a glass base material and a laminated wiring layer; and
a protective member that protects the sensor chip, wherein:
the sensor chip and the wiring board are joined via a bump unit including a plurality of bumps,
the bump unit includes a first bump and a second bump,
the first bump is formed on the sensor chip and the second bump is formed on the first bump before the sensor chip and the wiring board are joined, and
an adhesive is arranged on the glass base material and the laminated wiring layer of the wiring board, and the glass base material and the laminated wiring layer of the wiring board are adhered to the protective member, and wherein
the adhesive includes a first adhesive and a second adhesive such that the first adhesive is arranged on a side surface of the glass base material and is arranged up to the protective member, and
the second adhesive is arranged between the glass base material and the protective member.

12. The imaging apparatus according to claim 11, wherein a black material that does not transmit visible light is the first adhesive.

13. An electronic device comprising an imaging apparatus mounted, the imaging apparatus including:
at least a sensor chip;
a wiring board having a glass base material and a laminated wiring layer; and
a protective member that protects the sensor chip, wherein:
the sensor chip and the wiring board are joined via a bump unit including a plurality of bumps,
the bump unit includes a first bump and a second bump,
the first bump is formed on the sensor chip, the second bump is formed on the first bump before the sensor chip and the wiring board are joined,
each of the plurality of bumps is formed by conductive members having substantially same composition, wherein
an adhesive arranged on the glass base material and the laminated wiring layer of the wiring board, and the glass base material and the laminated wiring layer of the wiring board are adhered to the protective member, and wherein
the adhesive includes a first adhesive and a second adhesive such that the first adhesive is arranged on a side surface of the glass base material and is arranged up to the protective member, and the second adhesive is arranged between the glass base material and the protective member.

\* \* \* \* \*